United States Patent [19]

Morinaga et al.

[11] Patent Number: 5,604,762
[45] Date of Patent: Feb. 18, 1997

[54] SEMICONDUCTOR OPTICAL DEVICE

[75] Inventors: Motoyasu Morinaga, Yokohama; Nobuo Suzuki, Tokyo; Masaki Tohyama, Souka, all of Japan

[73] Assignee: Kabushiki Kaisha Toshiba, Kanagawa-ken, Japan

[21] Appl. No.: 346,250

[22] Filed: Nov. 23, 1994

[30] Foreign Application Priority Data

Nov. 25, 1993 [JP] Japan .................. 5-295398
Mar. 15, 1994 [JP] Japan .................. 6-070155

[51] Int. Cl.$^6$ ............................................. H01S 3/19
[52] U.S. Cl. .................................. 372/43; 372/46
[58] Field of Search .................. 372/45, 43, 46; 357/16

[56] References Cited

U.S. PATENT DOCUMENTS

| | | | |
|---|---|---|---|
| 4,796,273 | 1/1989 | Yamaguchi | 372/45 |
| 5,034,783 | 7/1991 | Chang et al. | 357/16 |
| 5,272,109 | 12/1993 | Motoda | 372/46 |
| 5,375,135 | 12/1994 | Okumura et al. | 372/45 |

OTHER PUBLICATIONS

Morinaga et al, "Thermal Frequency Drift Suppression in Tunable DFB Lasers by Plasma Induced Frequency Shift Enhancement", IEEE Photonics Technology Letters, vol. 6, No. 4, Apr. 1994.

*Primary Examiner*—Rodney B. Bovernick
*Assistant Examiner*—Yisun Song
*Attorney, Agent, or Firm*—Finnegan, Henderson, Farabow, Garrett & Dunner, L.L.P.

[57] ABSTRACT

A semiconductor optical device includes a n-clad layer, an active layer formed on the n-type clad, a carrier reservoir layer formed on the active layer, and a p-clad layer formed on the carrier reservoir layer. The thickness of the carrier reservoir layer is in a range where the oscillation wavelength shifts in a short wavelength direction with increasing driving current.

48 Claims, 13 Drawing Sheets

5,604,762

SEMICONDUCTOR OPTICAL DEVICE

BACKGROUND OF THE INVENTION

1. Field of the Invention

This invention relates to a semiconductor optical ice, such as a laser which is optical frequency tunable.

2. Description of the Related Art

Optical frequency tunable lasers are key devices for coherent optical frequency division multiplexed (FDM) networks. Rapid tunability and narrow spectral linewidth are essential for such tunable lasers.

Distributed feedback (DFB) lasers are attractive for such system because of their narrow spectral linewidth during optical frequency tuning. A DFB laser has a grating to constitute a cavity in an active region where radiation occurs.

A frequency drift is caused by a thermal effect and plasma effect. The frequency drift is caused by a change of the refractivity of the cavity. The frequency drift caused by the change of the carrier density is known as a plasma effect. The density of carriers in the cavity is increased with the driving current. The increase in the carrier density causes the refractivity of the cavity to decrease. As a result, an oscillation frequency becomes high. In other words, the oscillation frequency is shifted to a short wavelength side, i.e. a blue shift. The amount of the plasma frequency shift in a conventional DFB laser is about −1 pm/mA and the response time of that is about 100 ps.

On the other hand, the temperature of the cavity becomes high with increasing driving current. The temperature rise causes the refractivity of the cavity to increase. As a result, an oscillation frequency becomes low. In other words, the frequency is shifted to a long wavelength side, i.e., a red shift. The frequency shift caused by the change of the temperature is known as a thermal effect. The amount of the thermal frequency shift in a conventional DFB laser is about +6 pm/mA and the response time is about 100 ms. The thermal frequency shift is slower, so we call it drift, and is larger than the plasma frequency shift.

The total drift is the sum of the thermal frequency drift and the plasma frequency drift. When the driving current is increased, first, the frequency will shift to a short wavelength side in 100 ps, then the frequency will drift to a long wavelength side across an initial wavelength and the drift will stop after 100 ms. In a DFB laser, the thermal frequency drift reverses the initial frequency shift due to the plasma effect and becomes dominant. The step response of the frequency is too complicated, 0(initial value)→(+)→0→(−). Therefore, a feedback control can not be used.

Meanwhile, a multi-electrode distribution Bragg reflector type (DBR) laser may have a large width of variable oscillation wavelength. The multi-electrode DBR laser includes a phase alignment region and a Bragg reflector region in addition to an active layer. These regions form a passive waveguide path in the cavity direction, wherein radiation does not occur. Electrodes are provided for each region. The injected currents to each region are controlled so as to change the refractivity of each region. As a result, frequency variable operation is performed.

In the passive waveguide path, since the carrier density is largely changed by the injected current, the plasma effect is predominant. As a result, in a multi-electrode DBR laser, the frequency can be quickly changed, because the response time of a carrier density change is short, measured in nanoseconds.

However, a spectral linewidth would be broadened to over 10 MHz during the optical frequency tuning, because of a recombination of carriers injected in the passive waveguide path. Therefore, it is considered that a DBR laser is not suitable for a coherent optical transmission.

SUMMARY OF THE INVENTION

Accordingly, an object of the present invention is to provide a semiconductor optical device whose frequency (wavelength) can be changed quickly and whose frequency shift (wavelength shift) direction does not change in transition.

Another object of the present invention is to provide a semiconductor optical device which can change frequency quickly and whose linewidth is narrow.

Another object of the present invention is to provide a semiconductor laser which can change frequency quickly and whose linewidth is narrow.

Another object of the present invention is to provide a semiconductor optical modulator which can change frequency quickly and whose linewidth is narrow.

Another object of the present invention is to provide a DBR laser whose spectral linewidth is narrow.

Another object of the present invention is to provide a DFB laser whose optical frequency can be changed quickly and whose frequency shift direction does not change in transition.

These and other objects of this invention can be achieved by providing a semiconductor optical device, such as a laser or optical modulator, comprising: an n-clad layer of an n-type semiconductor; a p-clad layer of a p-type semiconductor; a semiconductor active layer, in which injected carriers recombine so as to emit light, disposed between the n-clad layer and the p-clad layer; and a semiconductor carrier reservoir layer disposed between the active layer and at least one of the p-clad layer and the n-clad layer, the carrier reservoir layer being sufficiently thick to accumulate carriers, such as about 0.3 μm or more, so as to enlarge an oscillation wavelength shift due to a plasma effect relative to an oscillation wavelength shift due to a thermal effect.

The thickness of the carrier reservoir layer is preferably in the range where an oscillation wavelength is shifted to a short wavelength direction with increasing driving current.

In other words, driving current preferably does not exceed the amount that the oscillation wavelength is shifted to a long wavelength direction with increasing the driving current.

The thickness of the carrier reservoir layer preferably satisfies the relation:

$$\xi_{rsv} \cdot L_{rsv} > 2\mu \cdot k \cdot T \cdot W \cdot L \cdot |\eta_T/\eta_N| 1/\mu = (1/2(1/\mu_e + 1/\mu_h)$$

$\xi_{rsv}$: optical confinement factor in carrier reservoir layer $L_{rsv}$: thickness of carrier reservoir layer $\mu$: effective carrier mobility in carrier reservoir layer $\mu_e$: electron mobility in carrier reservoir layer $\mu_h$: hole mobility in carrier reservoir layer k: Boltzmann's constant T: absolute temperature W: width of carrier reservoir layer L: length of carrier reservoir layer $\eta_T$: wavelength shift per current due to thermal effect $\eta_N$: wavelength shift per carrier density due to plasma effect.

The present invention further provides a semiconductor optical device comprising an optical waveguide region or a passive region to modulate wavelength of light, wherein the passive region or optical wave guide region comprises plural semiconductor layers separated by an insulator layer so as to spatially separate electrons and holes injected into the passive region or optical wave guide region in different layers and to modulate the light by changing the amount of the injected electrons and holes.

The present invention also provides a semiconductor photo device comprising an optical wave guide region or a passive region to modulate wavelength of light, wherein the passive region or optical wave guide region comprises a first semiconductor layer, having an electronic affinity $\chi_1$ and a band-gap energy $Eg_1$, and a second semiconductor layer having an electronic affinity $\chi_2$ and a band-gap energy $Eg_2$, wherein $\chi_1$, $\chi_2$, $Eg_1$ and $Eg_2$ satisfy the relation:

$$\chi_1 > \chi_2, \chi_1 + Eg_1 > \chi_2 + Eg$$

BRIEF DESCRIPTION OF THE DRAWING

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Embodiments of the present invention will be described below with reference to the accompanying drawings. In the embodiments, substantially like parts or members having like function are designated by like numerals, and their duplicated description will be omitted.

As mentioned above, a DFB laser has a narrow linewidth during optical frequency tuning. However, thermal effect dominates frequency drift. Accordingly, the present inventors considered a method and structure to enhance a blue frequency shift due to the plasma effect in a DFB laser.

As a result, the inventors discovered the structure comprising a carrier reservoir layer which can store carriers formed on an active layer. The reservoir layer may be a guide layer having sufficient thickness, for example, more than 300 nm, so as to dominate a frequency shift, i.e. for the blue frequency shift to surpass the red frequency shift due to the thermal effect.

Figure 1:
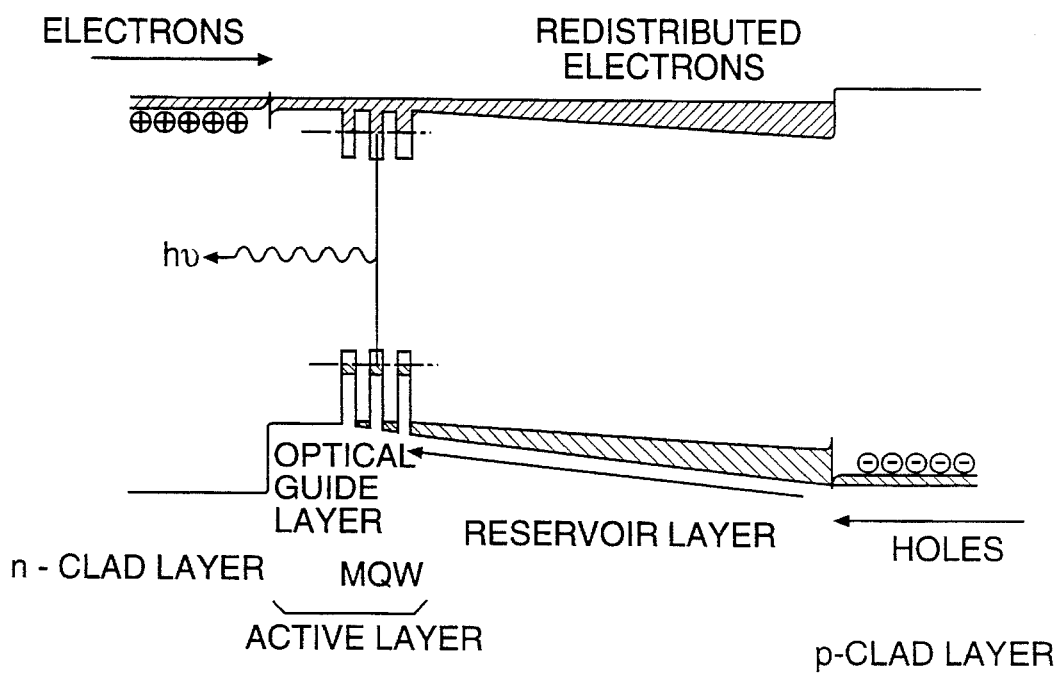
FIG. 1 is a graph showing a schematic band structure of a semiconductor laser according to one embodiment of the present invention.

FIG. 1 is a schematic band diagram of a semiconductor laser including the carrier reservoir layer. An active layer, including MQW (multi-quantum well), is placed between an n-clad layer and a p-clad layer. An optical guide layer is inserted between the n-clad layer and the active layer. Further, the reservoir layer is inserted between the active layer and the p-clad layer.

Electrons are injected from the n-clad layer to the active layer, and holes are injected from the p-clad layer to the active layer. In the active layer, electrons and holes recombine so as to radiate light (hυ). In the reservoir layer, electrons are redistributed to maintain charge neutrality because of the large mobility.

The reservoir layer increases the carrier transport time. Assuming that the hole and electron densities are approximately equal in the reservoir layer, the carrier transport time through the reservoir layer is given by the formula (1):

$$\tau_{trn} = (L_{rsv}^2/2) \cdot (\frac{1}{2}D_h + \frac{1}{2}D_h) = (q \cdot T_{rsv}^2/2kT) \cdot (\frac{1}{2}\mu_h + \frac{1}{2}\mu_e) \quad (1)$$

$\tau_{trn}$: carrier transport time through reservoir layer;

$L_{rsv}$: thickness of reservoir layer;

$D_h$: hole diffusion constant in reservoir layer;

$D_e$: electron diffusion constant in reservoir layer;
q: electron charge;
k: Boltzmann's constant;
T: absolute temperature;
$\mu_h$: hole mobility in reservoir layer; and
$\mu_e$: electron mobility in reservoir layer.

The carrier transport time increases the variation of carrier density with current as given by the formula (2):

$$\Delta N = [\tau_{trn}/(q \cdot V_{rsv})] \cdot \Delta I \tag{2}$$

$\Delta N$: change of carrier density N in reservoir layer
$N \approx N_h \approx N_e$
$N_h$: hole density in reservoir layer,
$N_e$: electron density in reservoir layer;
$V_{rsv}$: volume of reservoir layer;
$\Delta I$: change of injection current I;
$\tau_{trn}$: carrier transport time through reservoir layer; and
q: electron charge.

An optical frequency shift is represented by the formula (3):

$$\Delta v = \xi_{rsv}(\alpha v/\alpha n)(\alpha n/\alpha N)(\alpha N/\alpha I)\Delta I + (\alpha v/\alpha n)(\alpha n/\alpha T)(\alpha T/\alpha I)\Delta I \tag{3}$$

n: refractivity of reservoir layer
$v$: optical frequency;
$\xi_{rsv}$: optical confinement factor in reservoir layer;
N: carrier density in reservoir layer;
I: injection current; and
T: absolute temperature.

The first term of the above formula(3) denotes the frequency shift due to the plasma effect, and the second term denotes the thermal frequency drift. When the first term is larger than the second term, the frequency shift due to the plasma effect overcomes the thermal frequency drift. In order that the first term be larger than the second term, the required thickness of the reservoir layer is given by the formula (4):

$$\xi_{rsv} L_{rsv} > 2\mu \cdot k \cdot T \cdot W \cdot L_c \cdot |(\alpha v/\alpha T)(\alpha T/\alpha I)/(\alpha v/\alpha N)| 1/\mu = (1/2) \cdot (\mu_h^{-1} + \mu_e^{-1}) \tag{4}$$

W: strip width;
$L_c$: reservoir layer length;
$\xi_{rsv}$: optical confinement factor in reservoir layer;
$L_{rsv}$: thickness of reservoir layer;
K: Boltzmann's constant;
T: absolute temperature;
$v$: optical frequency;
I: injection current; and
N: carrier density in reservoir layer.

When the hole mobility is much smaller than the electron mobility ($\mu_h \ll \mu_e$), the required thickness of the reservoir layer is given by the next formula (5):

$$\xi_{rsv} L_{rsv} > 4\mu \cdot k \cdot T \cdot W \cdot L_c \cdot |(\alpha v/\alpha T)(\alpha T/\alpha I)/(\alpha v/\alpha N)| \tag{5}$$

For example, the Hall mobility for holes at room temperature in InGaAsP, whose band-gap energy corresponds to a wavelength $\lambda_g$ of 1.3 μm, is about 60 cm$^2$/Vs, and the thermal frequency drift of the DFB lasers is about $-0.8$ GHz/mA. When the strip width is 1.0 μm and the reservoir layer length is 300 μm, the right-hand of the above formula (5) is 220 nm.

Since $\lambda \cdot v = c/n$ [$\lambda$: wavelength, $v$: optical frequency, c: light velocity, n: refractivity], the formula (4) can be replaced by the following formulas:

$$\xi_{rsv} L_{rsv} > 2\mu \cdot k \cdot T \cdot W \cdot L_c \cdot |(\alpha \lambda/\alpha T)(\alpha T/\alpha I)/(\alpha \lambda/\alpha N)| \tag{4'}$$

$$\xi_{rsv} L_{rsv} > 2\mu \cdot k \cdot T \cdot W \cdot L_c \cdot |(\alpha n/\alpha T)(\alpha T/\alpha I)/(\alpha n/\alpha N)| \tag{4''}$$

The right-hands of these formulas (4), (4') and (4") indicate the same value. Therefore, these formulas can be replaced by the formula (6):

$$\mu_{rsv} L_{rsv} > 2\mu \cdot k \cdot T \cdot W \cdot L_c \cdot |\eta_T/\eta_N| \tag{6}$$

$\eta_T$: amount of a shift of wavelength (frequency) or refractivity in response to driving current due to the thermal effect
$\eta_N$: amount of a shift of wavelength (frequency) or refractivity in response to the carrier density due to the plasma effect.

In the case of refractivity, frequency, and wavelength, the ratio of $\eta_T/\eta_N$ is the same.

Figure 2A:
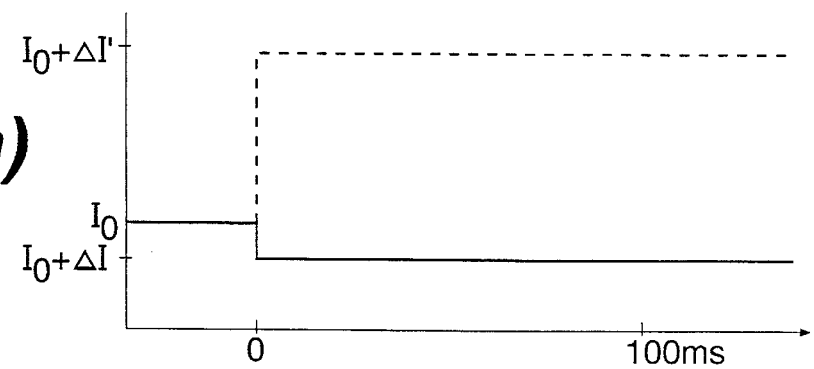
FIGS. 2(a) and (b) are graphs showing a transition of a wavelength of the embodiment.
Figure 2B:
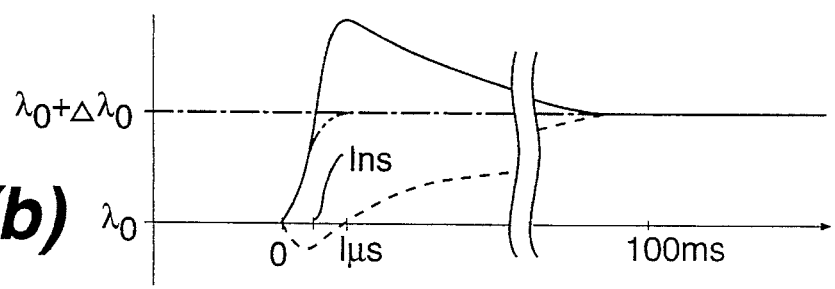

FIG. 2 shows a schematic transition of wavelength shifts of the present invention and a conventional laser without the reservoir layer. In the conventional laser, the oscillation wavelength is initially shifted to the shorter wavelength side by the wavelength shift due to the plasma effect, as indicated by the dotted line in FIG. 2(b) with increasing drive current from the initial current $I_0$ by $\Delta I'$ as indicated by the dotted line in FIG. 2(a). Thereafter, the oscillation wavelength is shifted to the long wavelength side across the initial wavelength $\lambda_0$ to become finally a wavelength of $\lambda_0 + \Delta\lambda_0$.

In contrast, in the present invention, the oscillation wavelength is shifted to the longer wavelength side by the plasma effect from the beginning, as indicated by the solid line in FIG. 2(b), by decreasing the drive current from the initial current from $I_0$ by $\Delta I$ as indicated by the solid line in FIG. 2(a). Thereafter, the oscillation wavelength is shifted to the long wavelength side to exceed temporarily a wavelength of $\lambda_0 + \Delta\lambda_0$. Thereafter, the oscillation wavelength becomes $\lambda_0 + \Delta\lambda_0$ by the wavelength shift due to the thermal effect.

The characterizing feature of the present invention is that the oscillation wavelength is shifted to a target wavelength without passing through the initial wavelength and without any complicated response, e.g., the oscillation wavelength is first shifted to the shorter wavelength side and then shifted to the longer wavelength side. As a result, it is possible to attain a feedback control of the drift immediately and to increase the response speed of the wavelength changing operation.

For example, $\Delta I$ can be controlled by feedback control so that a wavelength $\lambda$ does not exceed the target wavelength ($\lambda_0 + \Delta\lambda_0$) in an initial stage when the thermal effect does not appear. Therefore, $\lambda$ can be stabilized at the target wavelength in nanoseconds. When the thermal effect appears, $\Delta I$ is controlled so as to cancel the shift by the thermal effect. As a result, the stability of the wavelength after wavelength-shift is good. Such control can be easily performed by detecting the emission from the laser and changing the driving current of the laser using the detected result. The controlled transition of the wavelength may be indicated by the chain double-dashed line in FIG. 2(b).

The above-mentioned effect can be obtained if the plasma effect is larger than the thermal effect. Accordingly, the device of the present invention is operated in the condition such that the plasma effect is larger than the thermal effect. In general, since the amount of shift due to the thermal effect is smaller than 10 pm/mA, the amount of shift due to the plasma effect is enough that $L_{rsv}$ is about 0.3 μm or more. The carrier density N preferably larger than about 10 pm/mA in absolute value. It is can be preferably changed to about $1 \times 10^{18}$ cm$^{-3}$ or more. However, if a condition, such as cooling efficiency, is improved, the requirement for the reservoir layer may be relaxed.

Embodiments of the present invention will now be described. In this specification, a compound semiconductor, which comprises at least three elements, is represented without ratios, such as InGaAsP for $(In_{1-x}Ga_x)(As_{1-y}P_y)$.

Figure 3:
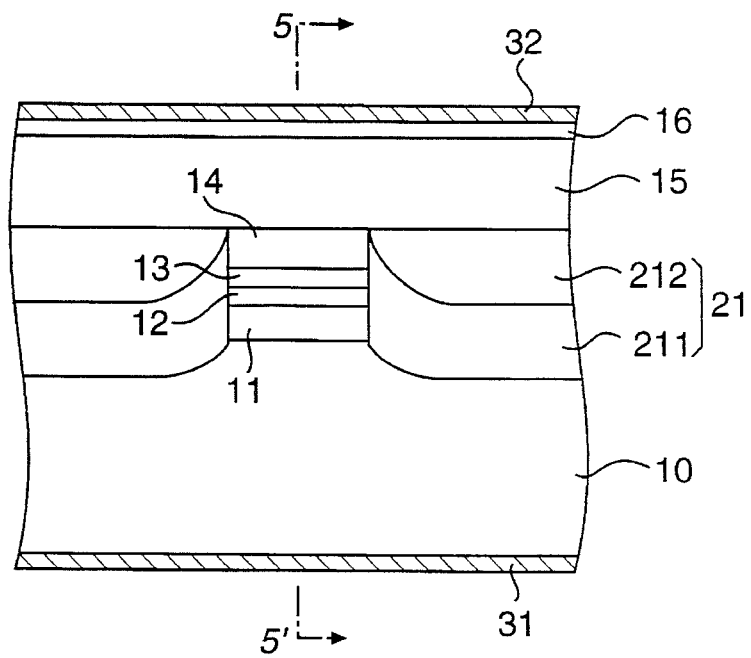
FIG. 3 is a sectional view of a semiconductor laser according to an embodiment of the present invention.
Figure 4:
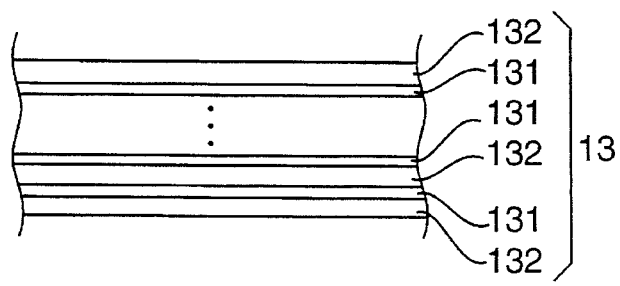
FIG. 4 is an enlarged, detail sectional view of the laser of FIG. 3.
Figure 5:
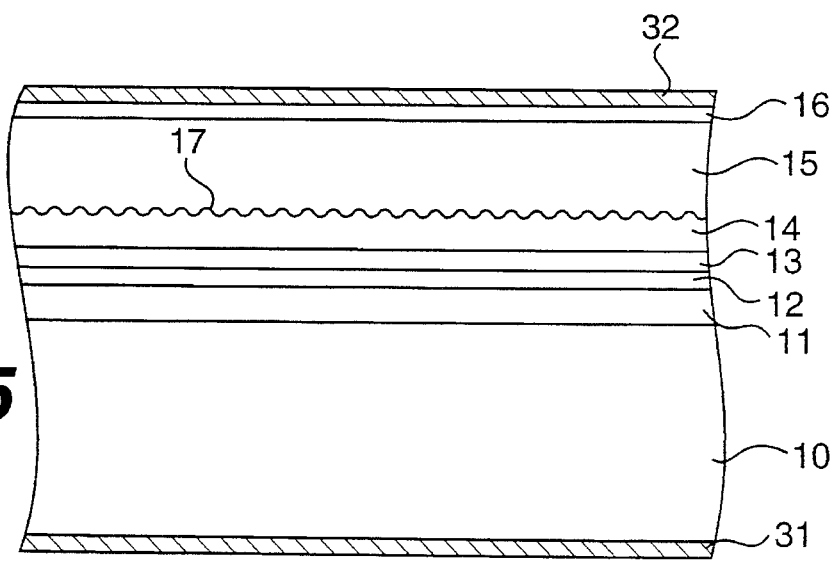
FIG. 5 is a sectional view taken along the line 5—5' of FIG. 3.

FIG. 3 is a schematic cross sectional view showing a structure of a wavelength variable DFB laser in accordance with a first embodiment of the present invention. FIG. 4 is an enlarged cross sectional view showing structural details of a multi-quantum well active layer shown in FIG. 3. FIG. 5 is a cross sectional view in a cavity direction taken along the line 5—5' of FIG. 3.

This embodiment includes a carrier reservoir layer 14 of InGaAsP ($\lambda_g=1.3$ µm), and the thickness of the reservoir layer is 600 nm. In this embodiment, each layer is epitaxially grown on a substrate 10, and lattice constants of the layers are the same as that of the substrate.

A buffer layer 11 of n-InP having a thickness of 100 nm and doped with Si at $1\times10^{-18}$ cm$^{-3}$ is formed on a substrate 10 of n-InP doped with Si at $1\times10^{-18}$ cm$^{-3}$. Carriers are injected through the substrate 10 and the buffer layer 11 into an active layer 13. Therefore, the concentration of the dopant is preferably between $1\times10^{-18}$ and $3\times10^{-18}$. In addition, since the substrate 10 and the buffer layer 11 fill the role of a n-clad layer and the light radiated in the active layer is confined, the refractivity is larger than that of the active layer 13. The buffer layer is effective to provide a flat surface with very few defects and preferably a thickness of about 100 nm or more. However, the buffer layer is not necessarily required.

An optical waveguide layer 12 of InGaAsP ($\lambda_g=1.3$ µm) having a thickness of 100 nm is formed on the buffer layer 11. An active layer 13 is formed on the optical waveguide layer 12 and includes a multi-quantum well structure which is composed of eight pairs of quantum wells 131 of undoped-InGaAs, each having a thickness of 7.2 nm and barriers 132 of undoped-InGaAsP ($\lambda_g=1.3$ µm) each having a thickness of 10 nm (FIG. 4). The optical waveguide layer 12 is effective to confine light and carriers in the active layer. Therefore, the band-gap energy and the refractivity are larger than that of the quantum wells 131, and smaller than that of the buffer layer 11, i.e. the n-clad layer. The thickness of the optical waveguide layer 12 is preferably less than 1000 nm. Excessive thickness may cause a high order mode of oscillation.

The carrier reservoir layer 14 of an undoped-InGaAsP ($\lambda_g=1.3$ µm) and having a thickness of 600 nm is formed on the active layer 13. In this embodiment, the reservoir layer 14 also fills the role of a waveguide layer on one side of a p-clad layer. The thickness of the reservoir layer is necessarily sufficient to ensure that the plasma effect surpasses the thermal effect. Therefore, the thickness is preferably about 300 nm or more, and more preferably larger than 450 nm. Excessive thickness may cause a high order mode of the oscillation. Therefore, reservoir layer thickness is preferably less than 1000 nm.

Still referring to FIG. 3, the optical waveguide layer 12, the active layer 13 and the carrier reservoir layer 14, each having a width of 1.2 µm, are formed into a mesa stripe. A current blocking layer 21 is embedded on both sides of the mesa stripe and is composed of a p-InP layer 211 doped with Zn at $1\times10^{-18}$ cm$^{-3}$ and an n-InP layer 212 doped with Si at $1\times10^{-18}$ cm$^{-3}$. The p-InP layer 211 is formed on the substrate 10, and the n-InP layer 212 formed on the p-InP layer 211. To avoid breakdown in reverse bias, the concentration of the dopant of the p-InP layer is preferably between $0.5\times10^{-18}$ and $2\times10^{-18}$ cm$^{-3}$, and that of the n-InP layer is preferably between $0.5\times10^{-18}$ and $5\times10^{-18}$ cm$^{-3}$. In this embodiment, the p-InP layers 211 cover the sides of the mesa stripe to improve emission-efficiency, however, this is not necessarily required. Further, the blocking layer 21 may be composed of an insulator material, such as semi-insulated semiconductor, e.g., InP doped with Fe, polyimide or silicon oxide and the like.

A p-clad layer 15 of p-InP doped with Zn at $1\times10^{-18}$ cm$^{-3}$ and having a thickness of 1 µm is laminated on the carrier reservoir layer 14 and the current blocking layer 21. Carriers are injected through the p-clad layer 15 into the active layer 13. Therefore, the concentration of the dopant is preferably between about $0.5\times10^{-18}$ cm$^{-3}$ and $2\times10^{-18}$ cm$^{-3}$. Further, the light radiated in the active layer is confined, therefore the refractivity of the p-clad layer 15 is larger than that of the reservoir layer 14, i.e., the waveguide layer at one side of the p-clad.

A contact layer 16 of p-InGaAsP doped with Zn at $2\times10^{-18}$ cm$^{-3}$ and having a thickness of 0.5 µm is laminated on the p-clad layer 15. The contact layer 16 is effective to provide an ohmic contact with an electrode. Therefore, the dopant concentration is preferably $1\times10^{-18}$ cm$^{-3}$ or more. The thickness is preferably 0.5 µm or more. However, if good ohmic contact can otherwise be made, the contact layer is not required.

A first electrode 31 of AuGe alloy is provided on a bottom surface of the substrate 10, and a second electrode 32 of AuZn alloy is provided on the contact layer 16 (FIG. 3).

A diffraction grating 17 having a pitch of 241 nm is formed in an interface between the carrier reservoir layer 14 and the p-clad layer 15 to constitute a distribution feedback type cavity, as seen in FIG. 5. The length of the cavity is 300 µm, which is equal to the mesa stripe length.

A phase shift region can be provided by the diffracting grating 17 so as to make a single oscillation peak. For example, at the phase shift region, the diffraction grating may be shifted by quarter wavelength $\lambda$, or the pitch of the grating may be changed so as to shift the phase by quarter wavelength $\lambda$.

In this embodiment, hole mobility $\mu_h$ in the reservoir layer 14 was about 60 cm$^2$/Vs at room temperature. The electron mobility $\mu_e$ was about 3500 cm$^2$/V·s. Accordingly, the effective mobility $\mu$ may be approximated by $2\mu_h$, i.e., 120 cm$^2$/Vs. An amount $\eta_T$, i.e., the amount of a wavelength shift to driving current due to the thermal effect, is about +6 pm/mA. An amount $\eta_N$, i.e., the amount of a wavelength shift to carrier density due to the plasma effect, is about $1\times10^{-18}$ nm·cm$^{-3}$.

A width W of the carrier reservoir layer 14 is 1.2 µm, and a length $L_C$ is 300 µm, the same as the cavity length. Since Boltzmann's constant k is $1.38\times10^{-23}$ J/K, when T=300K (room temperature), the right side of the above-mentioned formula (6) is about 215 nm.

On the other hand, the optical confinement factor in reservoir layer $\xi_{rsv}$ which is determined according to the correlation of the refractivity and the thickness of this layer (14) and the refractivity and the thickness of surrounding layers, is calculated at about 0.6, and a thickness $L_{rsv}$ is 600 nm. Therefore, the left side of the above-mentioned formula (6) is about 360 nm. It is understood that this embodiment meets the requirements of formula (6).

The laser of this embodiment was oscillated in a single mode at a wavelength of 1.55 µm. An amount of wavelength shift relative to the injected current of the laser was about −14 pm/mA. This may be interpreted to be the combined result of the wavelength shift of −20 pm/mA by the plasma effect and that of +6 pm/mA by the thermal effect. The amount of the wavelength shift caused by the plasma effect is about twenty times larger than that of the conventional laser having no reservoir layer and about 3.3 times larger than that caused by the thermal effect.

The response of the wavelength shift relative to a step current of 10 mA was such that the wavelength was shifted to the shorter wavelength by 200 pm for an initial stage of 2 ns and returned by 60 pm in 100 ms thereafter. The wavelength was stabilized at a wavelength shorter than the initial value by 140 pm.

Since the wavelength shift of this embodiment only occurs on the shorter wavelength side, it is possible to suppress, by a feedback control, the drift of 60 pm which was generated after the initial stage. As a result, a swift switching may be realized with an initial period of 2 ns.

A frequency modulation efficiency of this embodiment was measured to be +2.5 GHz/mA at the modulation frequency of 100 MHz, at which the measurement is not affected by heat because temperature change can not follow the modulation of injection current. This value is equal to −20 pm/mA at a wavelength of 1.55 μm, the oscillation wavelength of this embodiment. This reflects the large amount of the wavelength shift by the plasma effect of this embodiment.

Also, when the modulation frequency is lowered, the frequency modulation efficiency is low because of the effect of heat, and the efficiency of this embodiment was +1.75 GHz/mA, i.e., −14 pm/mA. However, the direction of the shift was always in a direction where the optical frequency is increased relative to the increase of the injection current, that is, the wavelength was shortened relative to the increase of the driving current. This is different from the tendency of the conventional laser, in which, when the modulation frequency is lowered, the amount of the frequency shift due to the thermal effect exceeds the frequency shift due to the plasma effect, so that the direction of the shift is reversed.

Also, to impart the same frequency shift, the change ΔI of the driving current may be lower than that of the conventional laser. This embodiment needed about 9.5 mA as ΔI for a 20 GHz oscillation frequency change, however the conventional laser needed about 94 mA. The amount of ΔI of this embodiment is about one-tenth that of the conventional laser.

Since the amount of ΔI of this embodiment is much less than the conventional laser, an amount of heat due to ΔI is less. Therefore, an amount of wavelength drift due to the thermal effect is less than the conventional laser. So, it may be possible to keep the wavelength constant for a long period of time using an automatic frequency control (AFC), such as using a feedback control.

Figure 6:
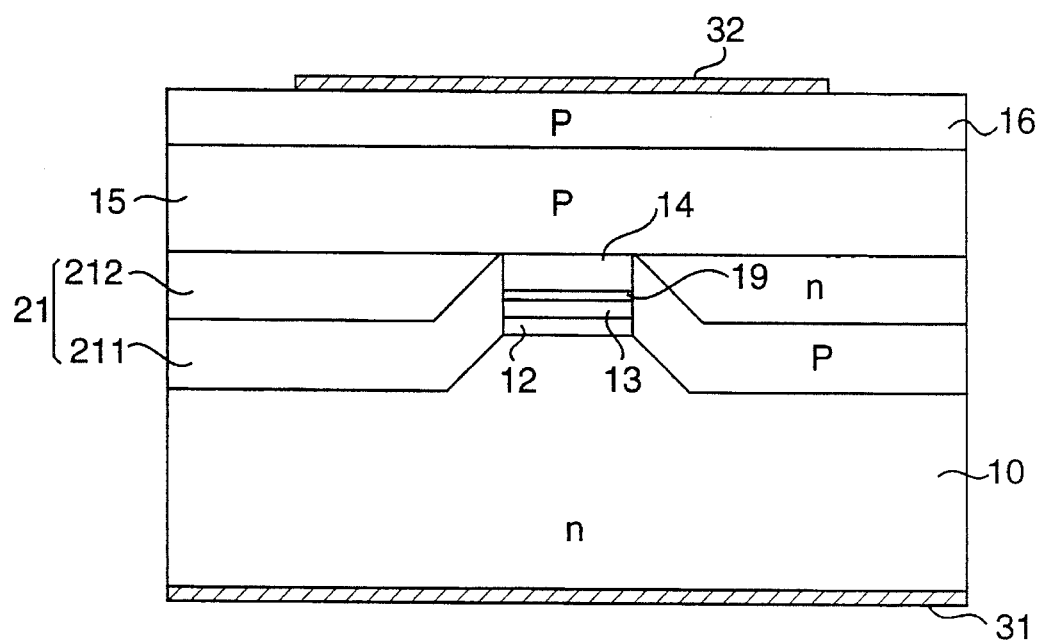
FIG. 6 is a sectional view of a semiconductor laser according to another embodiment of the present invention.

FIG. 6 shows a second embodiment of the present invention. Incidentally, the same reference numerals are used to indicate the same components as in FIG. 1 and duplicated explanation will be omitted.

It is a principal difference from the first embodiment that the second embodiment provides a barrier layer 19 of undoped-InGaAsP ($\lambda_g$=1.15 μm) between an active layer 13 and a carrier reservoir layer 14. The thickness of this barrier layer is about 10 nm.

Further, the buffer layer 11 of FIG. 3 is omitted. Therefore, the optical waveguide layer 12 of n-InGaAsP ($\lambda_g$=1.3 μm) and having a thickness of 200 nm is formed directly on a substrate 10. Moreover, the diffraction grating is not necessarily required between the carrier reservoir layer 14 and the p-clad layer 15 of FIG. 5. Therefore, in this embodiment, the diffraction grating 17 is formed in an interface between the substrate 10 and the optical waveguide layer 12.

Figure 7A:
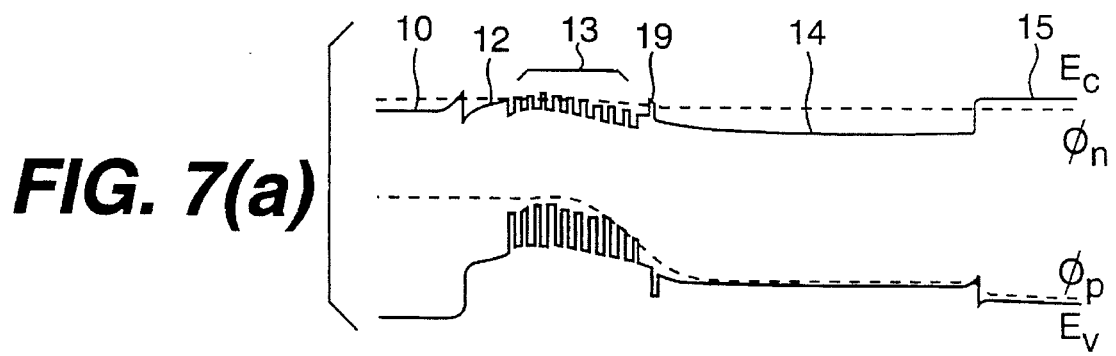
FIGS. 7(a) and (b) are graphs showing a band-energy structure of the laser of FIG. 6.
Figure 7B:
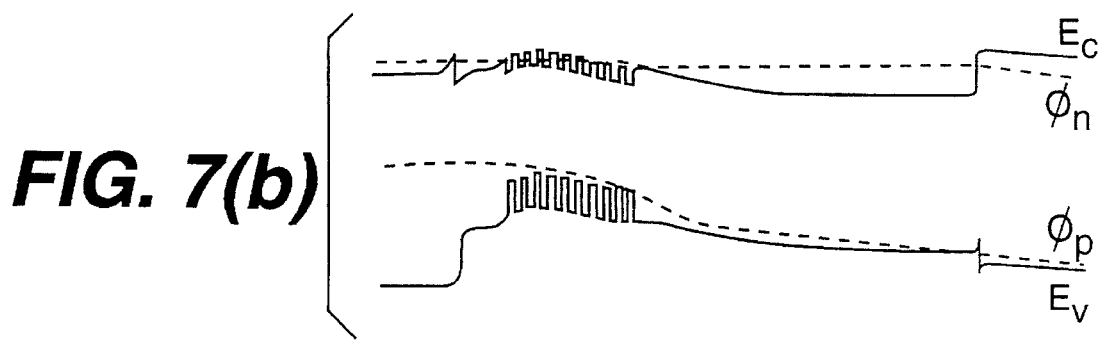

FIG. 7(a) shows a band-energy structure close to the active layer 13 during the bias state of the laser of this embodiment. FIG. 7(b) shows a band-energy structure of the first embodiment. A dotted line in these figures represents quasi-Fermi energies relative to electrons and holes.

Figure 8A:
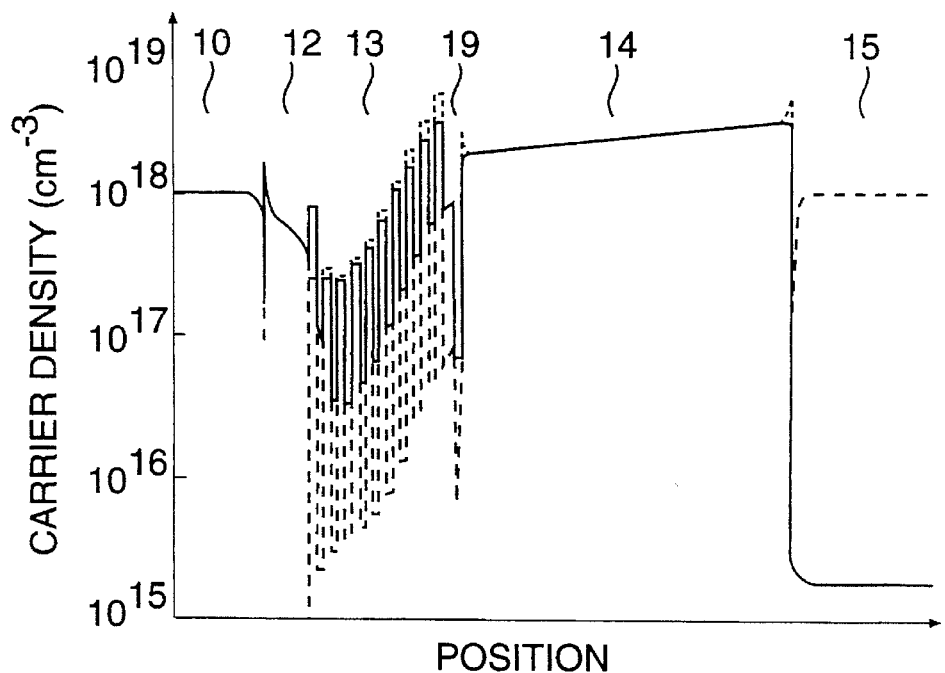
FIGS. 8(a) and (b) are graphs showing a carrier density of the laser of FIG. 6.
Figure 8B:
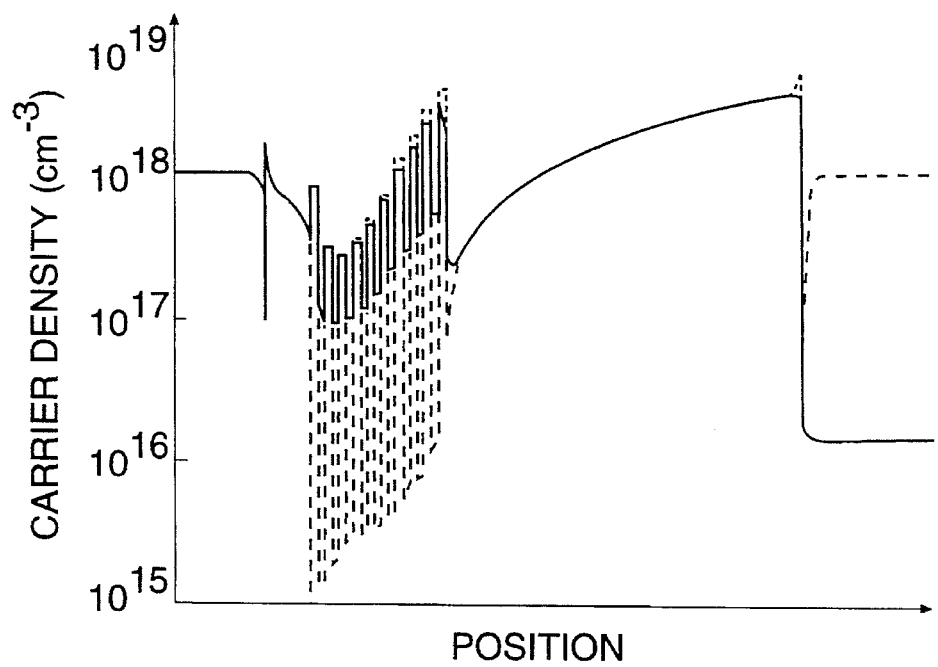

FIG. 8(a) shows a carrier distribution close to the active layer 13 of the second embodiment, and FIG. 8(b) shows that of the first embodiment. In these figures, a solid line represents a distribution of electron density, and a dotted line represents that of hole density.

In the first embodiment, since the active layer 13 is an absorption inlet for carriers, the carrier density of the carrier reservoir layer 14 close to the active layer 13 is low, whereas in the second embodiment, since the barrier layer 19 is present, the carrier density of the carrier reservoir layer 14 close to the active layer 13 is higher than that of the first embodiment. It is understood that the non-uniformity in carrier distribution within the carrier reservoir layer 14 is moderated in the second embodiment.

Figure 9A:
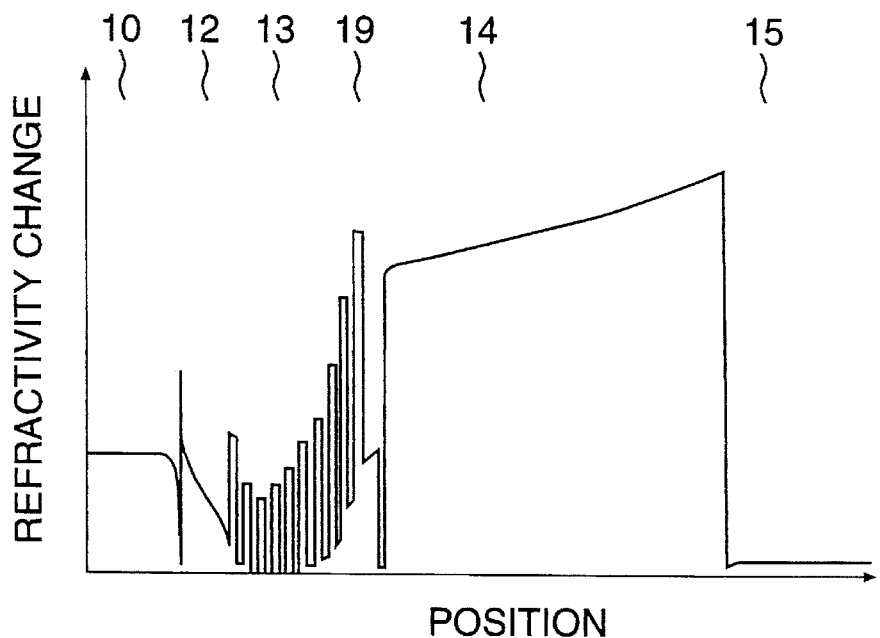
FIGS. 9(a) and (b) are graphs showing a refractivity of the laser of FIG. 6.
Figure 9B:
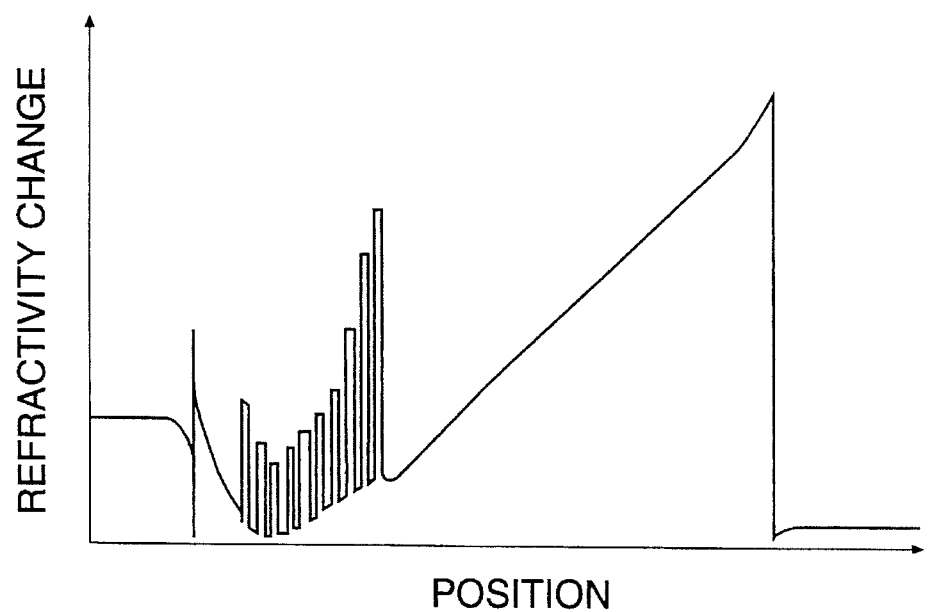

FIG. 9(a) shows a change in relative index by the plasma effect close to the active layer 13 of the second embodiment. FIG. 9(b) shows that of the first embodiment. Reflecting the improvement in the carrier density distribution within the carrier reservoir layer 14, a large refractivity change is realized even on the active layer side of the carrier reservoir layer 14.

Figure 10:
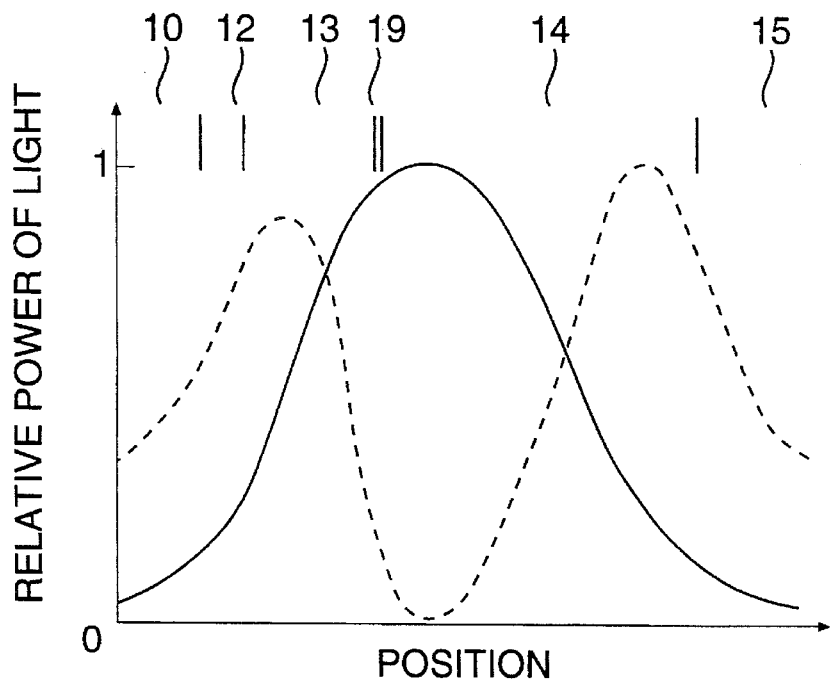
FIG. 10 is a graph showing relative energy of light in the wave guide of the laser of FIG. 6.

FIG. 10 shows a light mode distribution according to the second embodiment. In the first embodiment, almost the same mode distribution is attained. In a high order mode indicated by the dotted line, since the overlap with the p-clad layer 15 having a large loss is remarkable, the oscillation may be effected in the fundamental mode indicated by the solid line. In the second embodiment, since the refractivity change of the part where the light energy is large is remarkable in comparison with the first embodiment, the equivalent refractivity change is large in the fundamental mode.

Figure 11:
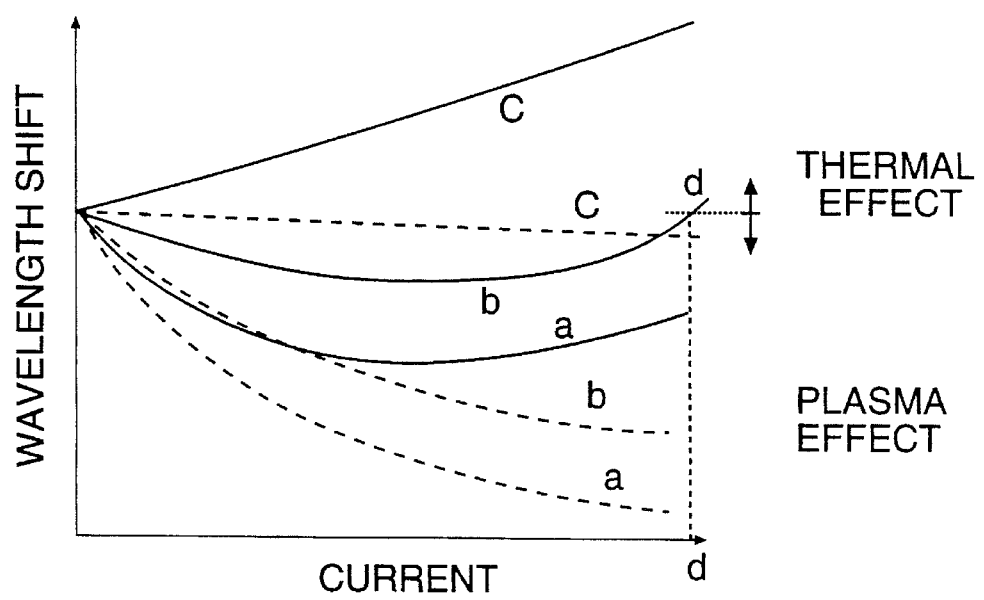
FIG. 11 is a graph showing wavelength shift of the laser of FIG. 6.

FIG. 11 shows a graph for comparison in wavelength shift relative to the injected current exceeding an oscillation threshold according to the second embodiment (a), the first embodiment (b) and the conventional semiconductor laser (c). Solid lines indicate continuous wave (cw) operations. Broken lines indicate pulse wave operations, where thermal effect can not follow the current change.

Since the conventional semiconductor laser does not have a carrier reservoir layer, the plasma effect is not particularly noticeable. Therefore, with increasing current, the amount of the change of wavelength increases due to the thermal effect in the cw operation. In the pulse operation, wavelength change does not substantially occur. However, in the first and second embodiment of this invention, the amount of wavelength decrease becomes large with increasing current. In the cw operation, the decrease of the wavelength change rate on the high current side is due to the fact that the carrier density increasing rate in the reservoir layer relative to the injected current is non-linear, i.e., saturation due to carrier recombination. For this reason, in the cw operation, the wavelength shift is generated in the opposite direction due to the heat generated by the high current injection.

The wavelength range where, in the cw operation, the blue shift can be realized is a range where high speed switching is possible. In this range the wavelength may be kept constant by compensating for the thermal drift with the plasma effect by current controlling. Therefore, the present invention is operated under the condition where the blue shift occurs in the cw operation. For example, the curve b to the left of line d—d in FIG. 11 represents the first embodiment. The position of line d—d may be changed by operating conditions, such as a cooling rate, and by the structure of the device, such as the reservoir layer thickness or composition. A large cooling rate of the device or large capacity of the carrier reservoir can shift the position of line d—d in the high current direction.

In the second embodiment, it is possible to obtain a larger wavelength change than in the first embodiment, and it is possible to suppress the affect of the thermal drift after the wavelength switching. Also, the wavelength range, where the wavelength may be kept constant even with high speed switching, can become wide.

The reservoir layer thickness of 0.3 μm of the second embodiment has almost the same effect as the 0.45 μm thickness of the first embodiment. Therefore, in the second embodiment, the same effect can be obtained with a thin reservoir layer. As a result, it is possible to improve alignment of the light with an optical fiber, alignment of the embedding layer process, and the process alignment in case of integration with other elements. In the case of the integration with other elements, it is possible to also use the reservoir layer as an optical waveguide layer. The barrier layer may be used as an etching stopper layer for the integration process, e.g., an InP layer can be used as an etching stopper layer for InGaAsP layer.

The second embodiment (FIG. 6) includes the carrier barrier layer 19 for improving uniformity of the carrier distribution in the reservoir layer 14. The barrier layer is sufficiently thick to impede carrier flowing into the active layer, and yet sufficiently thin so as to adequately inject carriers into the active layer for radiating. Therefore, the band-gap energy is larger than the active layer or the barrier of an MQW.

Figure 12:
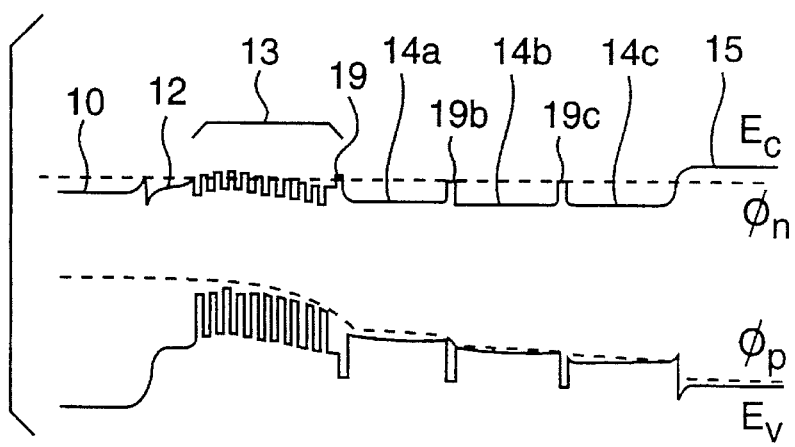
FIG. 12 is a graph showing the band-energy structure of a semiconductor laser according to another embodiment of the present invention.

FIG. 12 shows a band structure close to the active layer of a semiconductor laser according to the third embodiment of the present invention. In this embodiment, the carrier reservoir layer is divided into three sections 14a, 14b and 14c by the barrier layers 19b and 19c of InGaAsP ($\lambda_g$=1.15 μm). A thickness of each barrier layer is 10 nm. A thickness of each section is 200 nm. The compositions of the reservoir layer are adjusted so that the closer to the active layer the section is, the smaller the band-gap energy is. The other layers are the same as the second embodiment.

Figure 13:
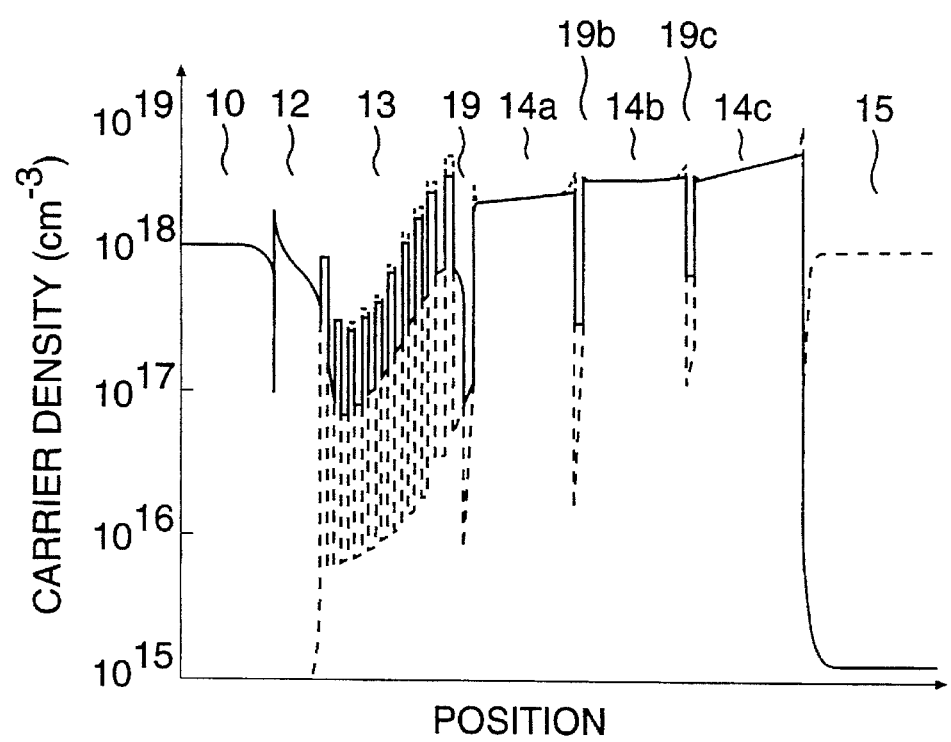
FIG. 13 is a graph showing a carrier density of the laser of FIG. 12.

FIG. 13 shows the carrier density distribution close to the active layer in the third embodiment. The carrier distribution is moderated within the respective sections 14a, 14b and 14c of the reservoir layer due to the barrier layers 19, 19b and 19c. The band-gap step in the reservoir layer sections causes the difference in carrier density between the sections to become also smaller. As a result, according to the third embodiment, it is possible to realize a larger wavelength shift than that of the first and second embodiment.

Incidentally, in the third embodiment, since the refractivity of the reservoir layer 14 is high on the active layer side, the peak of the fundamental mode of light may be close to the active layer.

Figure 14A:
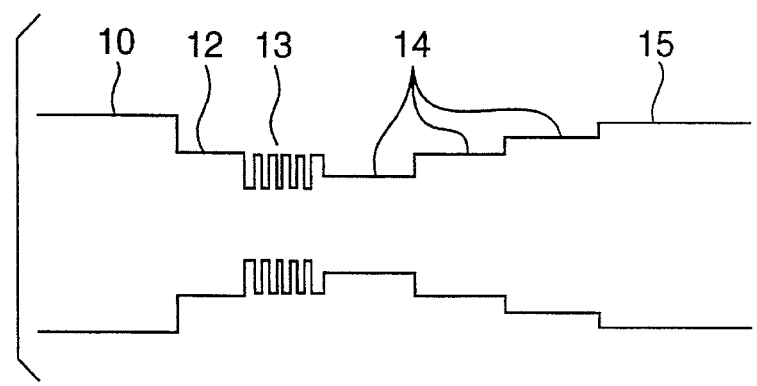
FIGS. 14(a), (b), and (c) are graphs showing a band-energy structure of a semiconductor laser according to another embodiment of the present invention.

FIG. 14(a), (b) and (c) show band structures of other embodiments of the present invention. These figures are drawn irrespective of the internal electric fields.

In the embodiment in FIG. 14(a), the composition of the carrier reservoir layer 14 is changed in a stepwise manner so that the band-gap energy of the reservoir layer sections decreases in the direction toward the active layer. Also, the band-gap energy of the section of the reservoir layer 14 next to the active layer side is smaller than that of the barrier of the MQW structure. The barrier of the MQW layer which is the closest to the reservoir layer 14, functions as the barrier layer.

Figure 14B:
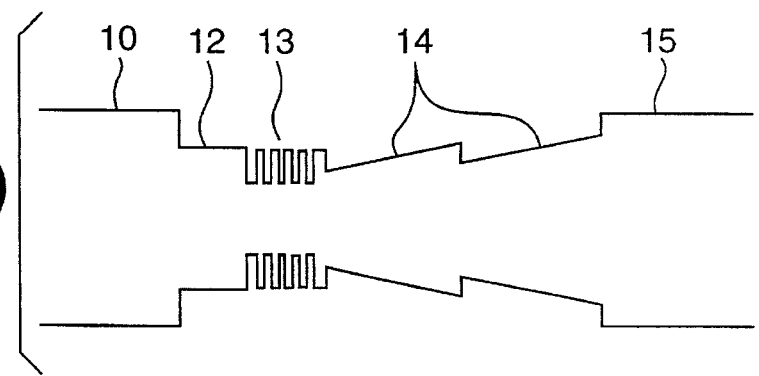

In the embodiment in FIG. 14(b), the carrier reservoir layer 14 is divided into first and second sections, each of which has a band-gap energy which progressively decreases in the direction toward the active layer. At the border, the first section of the reservoir layer next to the active layer becomes the barrier layer to the carriers in the second section of the reservoir layer.

Figure 14C:
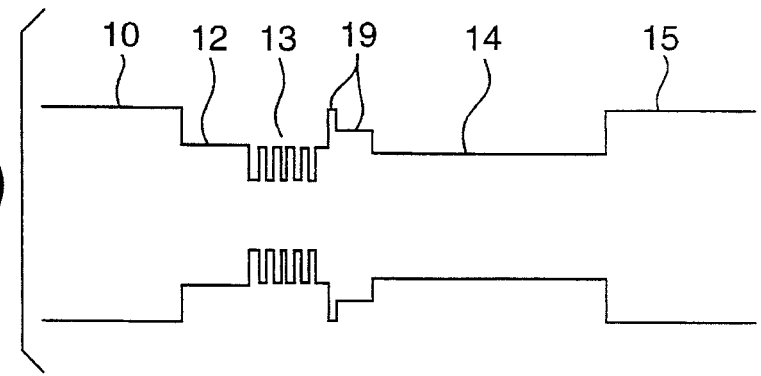

In the embodiment in FIG. 14(c), an InP layer, which is also used as the etching stopper layer, constitutes a part of the barrier layer 19. The barrier layer 19 includes an InP layer next to the active layer and an InGaAsP layer next to the reservoir layer. As a result, it is possible to moderate a barrier that is too high, so that excessive reduction in the carrier injection efficiency to the active layer is prevented.

In the above-mentioned embodiments, since the hole mobility is smaller than the electron mobility, the reservoir layer is provided on the p-clad side of the active layer. However, if a material wherein the electron mobility is smaller than the hole mobility is used, the reservoir layer is provided on the n-clad side of the active layer. Further, the reservoir layer may be provided on both sides of the active layer.

In the above-mentioned embodiments, the carrier reservoir layer is used. However, a problem in a DBR laser is carrier recombination in a passive region. In the following embodiments, structures to decrease the carrier recombination in the passive layer is provided.

Figure 15:
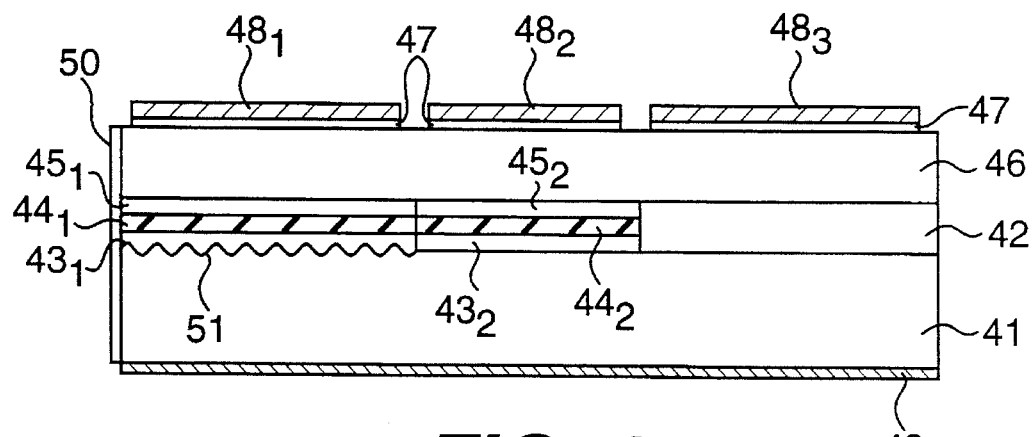
FIG. 15 is a sectional view of a semiconductor laser according to another embodiment of the present invention.

FIG. 15 shows a cross-sectional view of an embodiment of a DBR laser of the present invention, taken along an active layer stripe. An active layer 42, such as layers 12, 13, 14 shown in FIG. 3 or only layer 13, is formed on a substrate 41 of n-InP.

A first reflector layer $43_1$ and a first alignment layer $43_2$ of undoped-InGaAsP are formed on the substrate 41. The first alignment layer $43_2$ is positioned between the active layer 42 and the first reflector layer $43_1$ on the surface of the substrate 41. A diffraction grating 51 is formed under the first reflector layer $43_1$. A first insulator layer $44_1$ and a second insulator layer $44_2$ of semi-insulator ZnSeTe are formed on the first reflector layer $43_1$ and the first alignment layer $43_2$, respectively. A second reflector layer $45_1$ and a second alignment layer $45_2$ of undoped-InGaAsP are formed on the first insulator layer $44_1$ and the second insulator layer $44_2$, respectively.

A p-clad layer 46 of p-InP is formed on the active layer 42, the second reflector layer $45_1$ and the second alignment layer $45_2$, continuously. On the p-clad layer 46, a contact layer 47 of p-InGaAs is formed in three divided sections in a cavity direction corresponding to the second reflector layer $45_1$, the second alignment layer $45_2$ and the active layer 42. First electrodes $48_1$, $48_2$, and $48_3$ are formed on the contact layer 47 and performs an ohmic contact with the contact layers 47. An second electrode 49 is formed on a bottom surface of the substrate 41 in ohmic contact with the substrate 41.

The portion providing the first reflector layer $43_1$, the first insulator layer $44_1$ and the second reflector layer $45_1$ is a Bragg reflector region. The portion providing the first alignment layer $43_2$, the second insulator layer $44_2$ and the second alignment layer is a phase alignment region. These portions provide a passive waveguide path.

A chip of the above-described laser is fixed to a heat sink (not illustrated), which serves as a grounding electrode, by AuSn soldering, and the heat sink is controlled to have a constant temperature by using a temperature sensor and a Peltier element. Each of the first electrodes $48_1$, $48_2$, $48_3$ is connected to a power supply line formed on a ceramic substrate (not illustrated) through bonding, so that carriers may be injected independently into each electrode. A low refractive film 50 having a refractivity of 1% or less, such as SiN$_x$, is coated on an open end face made of a cleavage plane on the first lower passive layer 43$_1$ side.

Holes injected into the first reflector layer 43$_1$ can not go beyond the first insulator layer 44$_1$, and also, electrons injected into the second reflector layer 45$_1$ can not go beyond the first insulator layer 44$_1$, because of the large band-gap energy of the insulator layer 44$_1$. Accordingly, if a voltage is applied between the first electrode 48$_1$ and the second electrode 49, the holes injected from the first electrode 48$_1$ are confined and accumulated in the second reflector layer 45$_1$. Also, the electrons injected from the second electrode 49 are confined and accumulated in the first reflector layer 43$_1$. Since the holes and electrons are spatially separated by the first insulator layer 44$_1$, it is difficult for carriers to be recombined.

In the same way, in the case where a voltage is applied between the first electrode 48$_2$ and the second electrode 49, it is difficult for carriers to be recombined.

According to this embodiment, since the carrier density in the passive waveguide path may be changed without carrier recombination, it is possible to change oscillation frequency at a high speed while keeping a narrow spectral linewidth.

Figure 16:
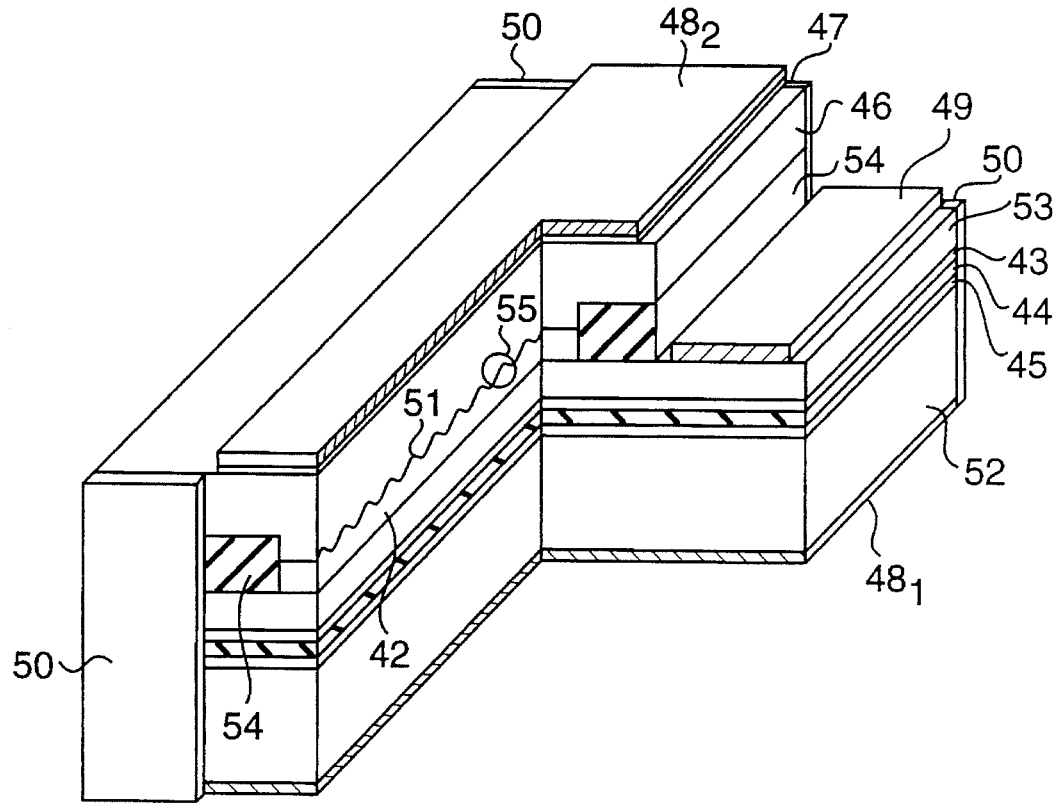
FIG. 16 is a perspective view, in partial cross section, of a semiconductor laser according to another embodiment of the present invention.

The structure of the waveguide of the DBR laser of the above-mentioned embodiment can be applied to a DFB laser. FIG. 16 shows a partially cutaway schematic perspective view of another embodiment of the present invention where a DFB laser has a double waveguide structure.

A second passive layer 45 of undoped-InGaAsP, an insulator layer 44 of SiO$_2$, a first passive layer 43 of undoped-InGaAsP, an n-clad layer 53 of n-InP and an active layer 42 of InGaAsP are laminated in order on a substrate 52 of p-InP. The active layer 42 is etched in a mesa shape. Side portions of the mesa-shaped active layer 42 are buried by an insulator layer 54 of semi-insulator InP. A p-clad layer 46 of p-InP and a p-contact layer 47 of p-InGaAs are laminated on the active layer 42 and the insulator layer 54.

A diffraction grating 51 is formed on the active layer 42. A phase shift region 55 corresponding to one-fourth wavelength (quarter λ) is formed in a central portion of the diffraction grating 51 in the cavity direction. Low reflective films 50 having a reflexivity of 1% or less, such as SiN$_x$, are coated on both end faces of a cleavage plane.

First electrodes 48$_1$ and 48$_2$ are formed, respectively, on a bottom surface of the substrate 52 and the top surface of the contact layer 47. And a second electrode 49 is formed in contact with the n-clad layer 53.

Carriers are injected into the active layer 42 from the first electrode 48$_2$ and the second electrode 49, whereas carriers are injected into the passive layers 43 and 45 from the first electrode 48$_1$ and the second electrode 49.

The active layer 42 and the passive layers 43, 45 are electrically structured so as to be injected with the carriers, respectively, but these layers are optically coupled to each other. By changing the refractivities of the passive layers 43 and 45, it is possible to change the oscillation frequency.

Holes injected into the passive layer 45 can not go beyond the insulator layer 44, and also, electrons injected into the passive layer 43 can not go beyond the insulator layer 44 because of the large band-gap energy of the insulator layer 44. Accordingly, if a voltage is applied between the first electrode 48$_1$ and the second electrode 49, the holes injected from the first electrode 48$_1$ are confined and accumulated in the passive layer 45. Also, the electrons injected from the second electrode 49 are confined and accumulated in the passive layer 43. Since the holes and electrons are spatially separated by the first insulator layer 44$_1$, it is difficult for carriers to be recombined.

According to this embodiment, since the carrier density in the passive waveguide path may be changed without carrier recombined, it is possible to change an oscillation frequency at a high speed while keeping a narrow spectral linewidth.

Figure 17:
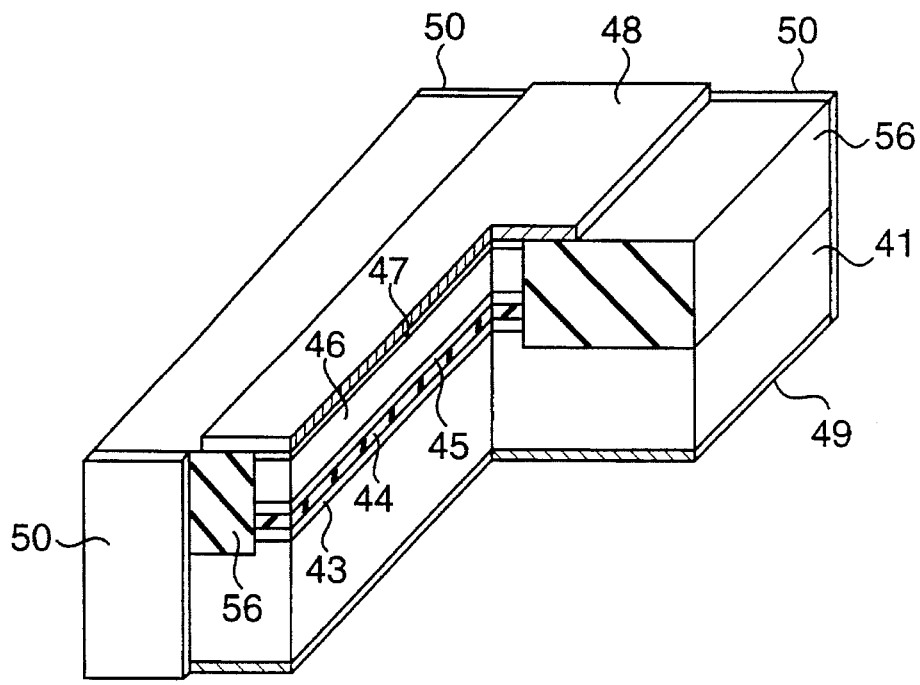
FIG. 17 is a perspective view, in partial cross section, of an optical modulator according to another embodiment of the present invention.

Further, the structure of the waveguide of the DBR laser of the above-mentioned embodiment can be applied to an optical modulator which can modulate a wavelength or a phase of incident light. FIG. 17 shows a partially cutaway schematic perspective view of an optical modulator of another embodiment of the present invention.

A first passive layer 43 of undoped-InGaAsP, an insulator layer 44 of SiO$_2$, a second passive layer 45 of undoped-InGaAsP, a p-clad layer 46 of p-InP and a p-contact layer 47 of p-InGaAs are laminated in order on a substrate 41 of n-InP. The first passive layer 43, the insulator layer 44, the second passive layer 45, the p-clad layer 46 and the p-contact layer 47 are etched into a mesa shape and thereafter are buried by a polyimide layer 56. A first electrode 48 and a second electrode 49 are formed, respectively, on a top surface of the p-contact layer 47 and a bottom surface of the substrate 41. Low reflective films 50 having a reflexivity of 1% or less, such as SiN$_x$, are coated on both end faces made of a cleavage plane.

Here, the first and second passive layers 43 and 45 are insulated from each other by the insulator layer 44. Therefore, the holes injected into the second passive layer 45 can not go beyond the insulator layer 44, and also, the electrons injected into the first passive layer 43 can not go beyond the insulator layer 44, because of the large band-gap energy of the insulator layer 44. Accordingly, if a voltage is applied between the first electrode 48 and the second electrode 49, the holes injected from the first electrode 48 are confined and accumulated in the second passive layer 45. Also, the electrons injected from the second electrode 49 are confined and accumulated in the passive layer 43. Since the holes and electrons are spatially separated by the first insulator layer 44, it is difficult for carriers to be recombined.

According to this embodiment, since the carrier density may be changed without carrier recombination, it is possible to change frequency at a high speed while keeping the narrow spectral linewidth.

Figure 18:
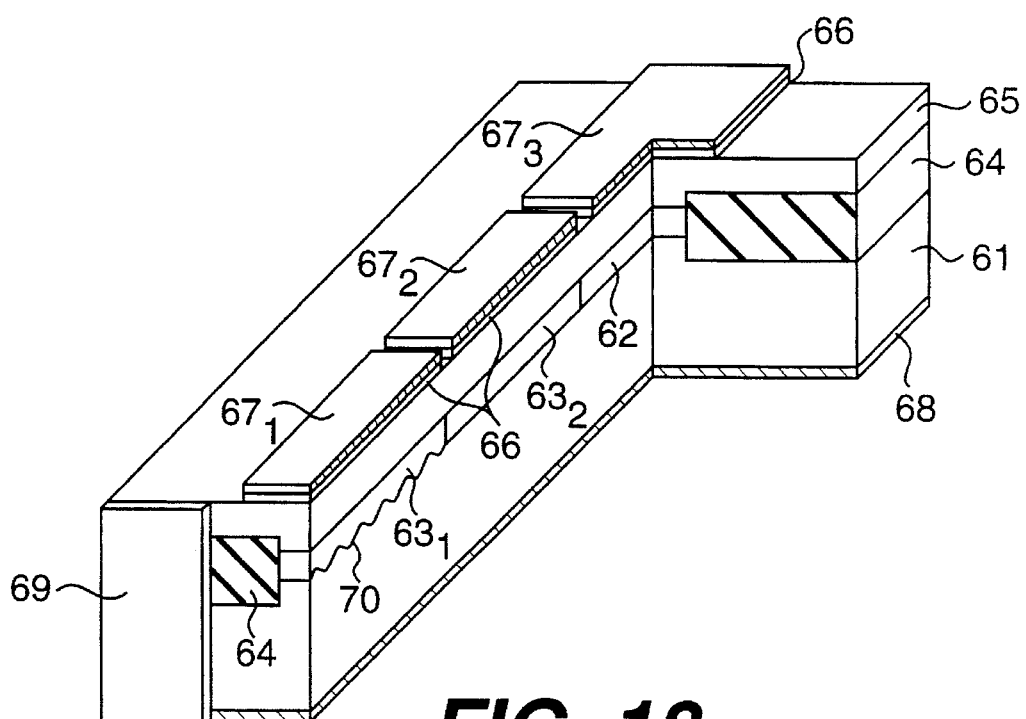
FIG. 18 is a perspective view, in partial cross section, of a semiconductor laser according to another embodiment of the present invention.

The present invention further provides another structure to separate holes and electrons. FIG. 18 shows a partially cutaway schematic perspective view of a multi-electrode DBR laser of another embodiment of the present invention.

An active layer 62, such as layers 12, 13, 14 shown in FIG. 3 or only layer 13, is formed on a substrate 61 of n-InP. A reflective layer 63$_1$ and an alignment layer 63$_2$ also are formed on the substrate 61. The alignment layer 63$_2$ is positioned between the active layer 62 and the reflector layer 63$_1$ in the surface of the substrate 61. A diffraction grating 70 is formed under the reflector layer 63$_1$. The active layer 62, the reflector layer 63$_1$ and the alignment layer 63$_2$ are etched in a mesa shape, and thereafter are buried by an insulator layer 64 of semi-insulator InP. A p-clad layer 65 of p-InP is formed on the active layer 62, the reflector layer 63$_1$, the alignment layer 63$_2$ and the insulator layer 64. On these layers, a p-contact layer 66 of p-InGaAs is formed, and further first electrodes 67$_1$, 67$_2$, 67$_3$ are separately formed in three sections corresponding to the reflector layer 63$_1$, the alignment layer 63$_2$ and the active layer 62 in the cavity direction. Furthermore, a second electrode 68 is formed on a bottom surface of the substrate 61.

A chip of the above-described laser is fixed to a heat sink (not illustrated), which is a grounding electrode, by AuSn soldering, and the heat sink is controlled to have a constant temperature by using a temperature sensor and a Peltier element. Each of the first electrodes $67_1$, $67_2$, $67_3$ is connected to a power supply line formed on a ceramic substrate (not illustrated) through bonding, so that carriers may be injected independently refractivity of 1% or less, such as $SiN_x$, is coated on an open into each electrode. A low refractive film 69 having a end face made of a cleavage plane.

Figure 19:
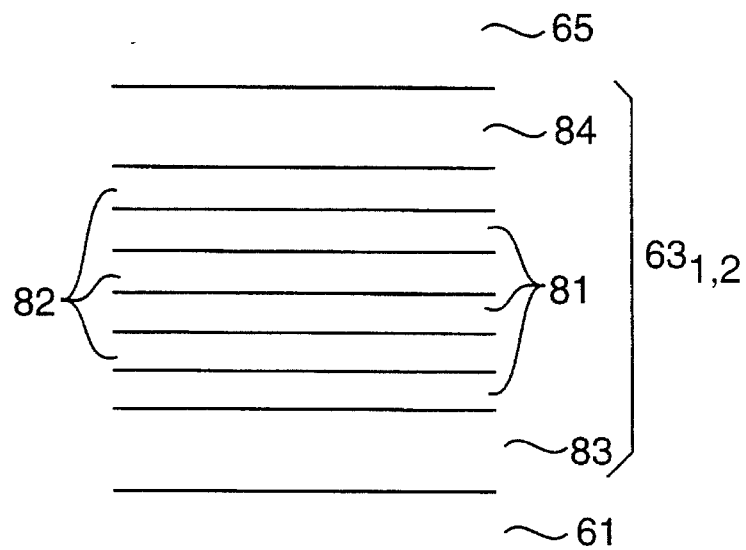
FIG. 19 is a partial sectional view of the laser embodiment of FIG. 18.

As shown in FIG. 19, each of the reflector layer $63_1$ and the alignment layer $63_2$ includes a first semiconductor layer 81 of undoped InGaAsP and a second semiconductor layer 82 of undoped InGaAlAs, both of which are alternatively laminated, and optical waveguide layers 83, 84 of InGaAsP are laminated to embrace the alternative structure.

Figure 20:
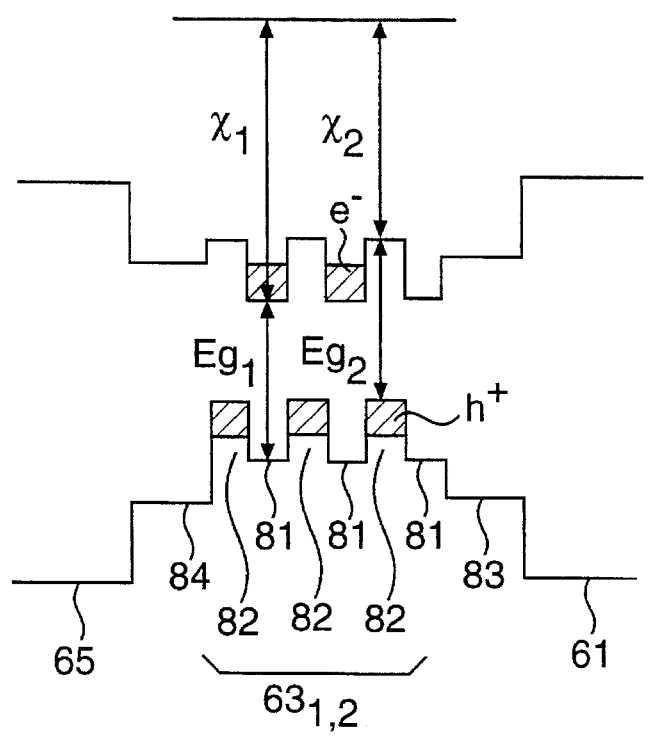
FIG. 20 is a graph showing an energy-band structure of the laser of FIG. 18.

FIG. 20 shows a band structure of the reflector layer $63_1$ and the alignment layer $63_2$ in the lamination direction. An electronic affinity $\chi_1$ of the first semiconductor layer 81 is larger than that of the layer 82. Accordingly, the layer 81 becomes a well relative to the electrons, and the injected electrons are confined in the layer 81. On the other hand, the sum of the electronic affinity $\chi_1$ and the band-gap energy $Eg_1$ of the layer 81 is larger than the sum of the electronic affinity $\chi_2$ and the band-gap energy $Eg_2$ of the layer 82. Accordingly, the layer 82 becomes a well for the holes, and the injected holes are confined in the layer 82.

The electrons and holes injected into the reflector layer $63_1$ and the alignment layer $63_2$ are spatially separated and confined in the different layers. As a result, the probability of carrier recombination is suppressed to a low level. According to this embodiment, since the carrier density in a passive waveguide path may be changed without carrier recombination, it is possible to change oscillation frequency at high speed while keeping the narrow spectral linewidth.

The combination of the first layer 81 and the second layer 82 is not limited to InGaAsP and InGaAlAs layers, respectively. It is only required that $\chi_1 > \chi_2$, $\chi_1 + Eg_1 > \chi_2 + Eg_2$. The number of the layers may be varied as desired.

Figure 21:
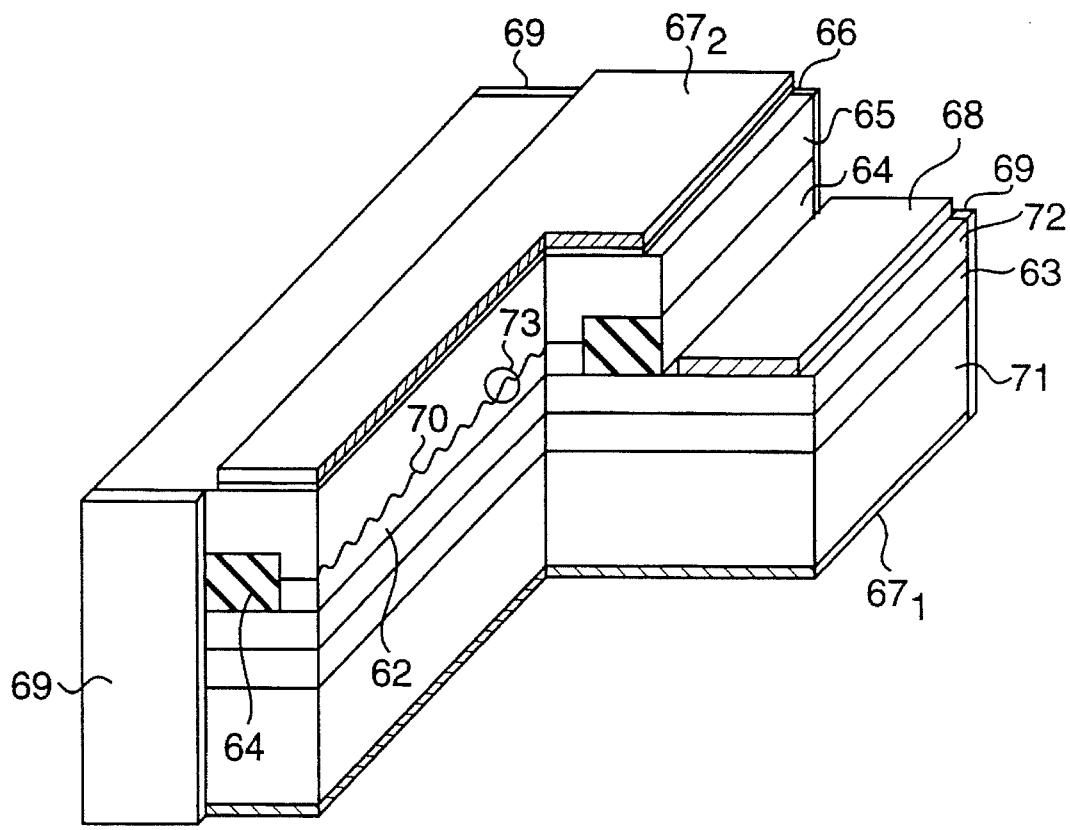
FIG. 21 is a perspective view, in partial cross section, of a semiconductor laser according to another embodiment of the present invention.

The waveguide structure of the DBR laser of the above-described embodiment can be applied to a DFB laser, as well as the structures of FIG. 15 and FIG. 16. FIG. 21 shows a partially cutaway schematic perspective view of a DFB laser having a double waveguide structure according to another embodiment of the present invention.

A passive layer 63, n-clad layer 72 of n-InP and an active layer 62 are laminated in order on a substrate 71 of p-InP. The active layer 62 is etched in a mesa shape. An insulator layer 64 of semi-insulator InP is laminated to bury the mesa-shaped active layer 62. A p-clad layer 65 of p-InP and a contact layer 66 of p-InGaAs are laminated on the active layer 62 and the insulator layer 64. A diffraction grating 70 is formed on the active layer 62. A phase shift region 73, corresponding one fourth wavelength, is formed in a central portion of the cavity of the diffraction or less, such as $SiN_x$, is coated on an open end face made of a grating 70. A low refractive film 69, having a refractivity of 1% cleavage plane. Electrodes $67_1$ and $67_2$ are formed, respectively, on a bottom surface of the substrate 71 and a top surface of the contact layer 66, and a second electrode 68 is formed in contact with the n-clad layer 72.

Carriers are injected into the active layer 62 from the electrode $67_2$ and the electrode 68, whereas carriers are injected into the passive layer 63 from the electrode $67_2$ and the electrode 68. The active layer 62 and the passive layer 63 are electrically structured so as to be injected with the carriers, separately, but are optically coupled to each other. By changing the refractivity of the passive layer 63, it is possible to change the oscillation frequency.

Figure 22:
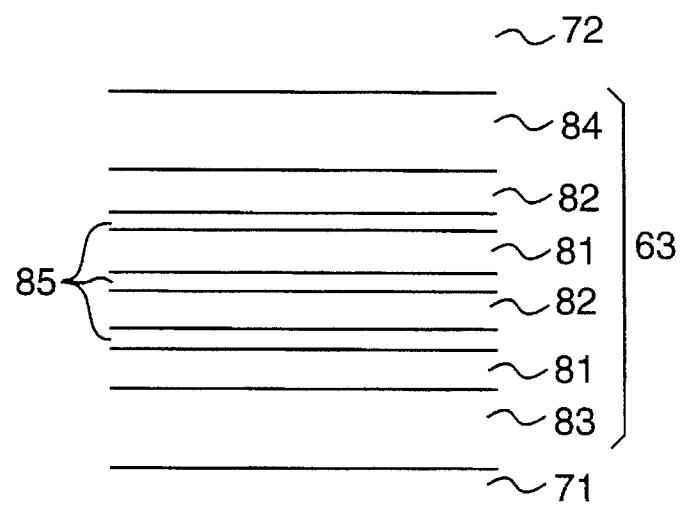
FIG. 22 is a partial sectional view of the laser embodiment of FIG. 21.

As shown in FIG. 22, the passive layer 63 includes a first semiconductor layer 81 of undoped-InGaAsP, a second semiconductor layer 82 of undoped-InGaAlAs, a third semiconductor layer 85 of undoped-InGaAlAs interposed between the first and second layers. The third semiconductor layer 85 has a larger band-gap energy than that of the second layer 82, and optical waveguide layers 83 and 84 of undoped-InGaAsP are laminated to embrace the laminated structure.

Figure 23:
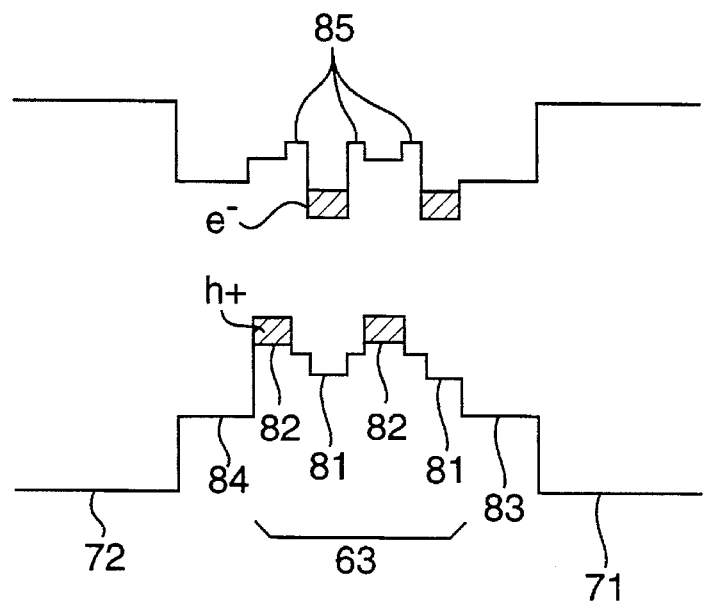
FIG. 23 is a graph showing an energy-band structure of the laser of FIG. 21.

FIG. 23 shows a band structure of the passive layer 63 of FIG. 21 in the lamination direction. In the same way as in the last embodiment, the injected electrons are confined in the layer 81, which has the largest electronic affinity, and the injected holes are confined in the layer 82, which has the smallest sum of the electronic affinity and the band-gap energy. The injected electrons and holes are spatially separated and confined in the different layers so as to suppress the probability of carrier recombination to a low level.

Furthermore, since the layer 81 and the layer 82 are separated from each other by the layer 85, recombination at the interfaces of the layers 81 and 82 of FIG. 22 is also suppressed.

According to this embodiment, since the carrier density may be changed without carrier recombination, it is possible to change an oscillation frequency at a high speed while keeping a narrow spectral linewidth.

Further, the waveguide structure of the DBR laser of the above-described embodiment can be applied to an optical modulator which can modulate a wavelength (frequency) or a phase of incident light as well as in the case of FIG. 17.

Figure 24:
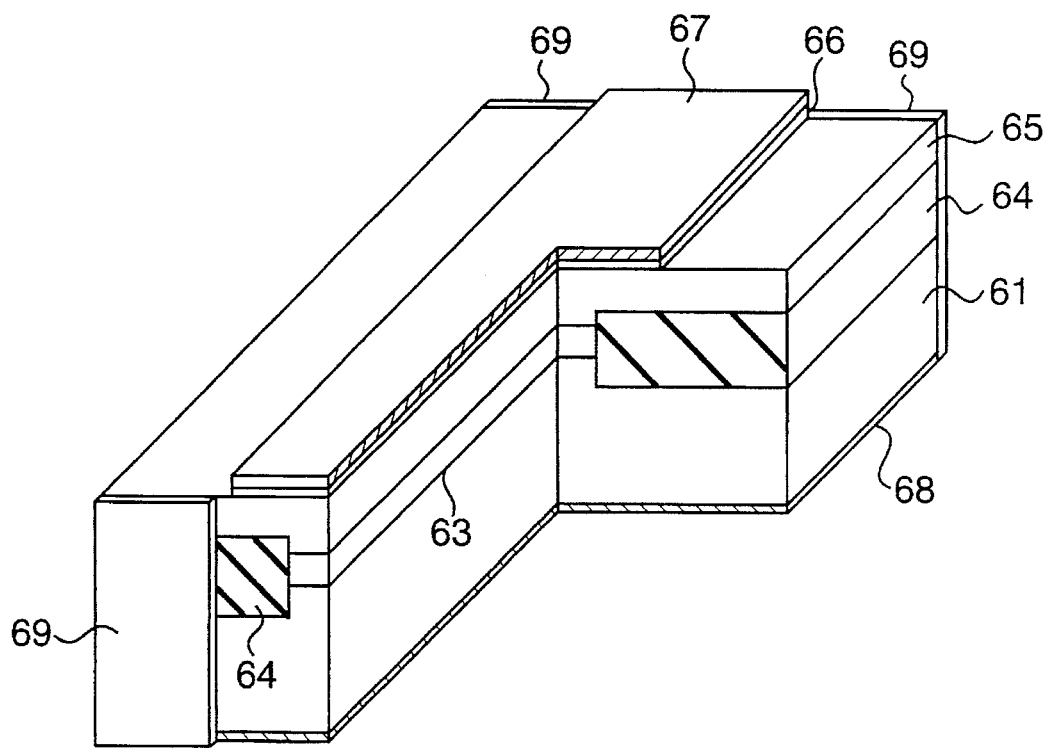
FIG. 24 is a perspective view in partial cross section of an optical modulator according to another embodiment of the present invention.

FIG. 24 shows a partially cutaway schematic perspective view of a waveguide type optical modulator of another embodiment of the present invention. A passive layer 63 is formed on a substrate 61 of n-InP. The passive layer 63 is etched in a mesa shape. An insulator layer 64 of semi-insulator InP is laminated to bury therein the side portions of the mesa shaped passive layer 63. A p-clad layer 65 of p-InP and a p-contact layer 66 of p-InGaAs are formed on the passive layer 63 and the insulator layer 64. A first electrode 67 and a second electrode 67 are formed, respectively, on a top surface of the contact layer 66 and on a bottom surface of the substrate 61. A low refractive film 69, having a refractivity of 1% or less, such as $SiN_x$, is coated on an open end face made of a cleavage plane.

The structure of the passive layer 63 is the same as in the semiconductor structure of FIG. 19 and FIG. 20. It is thus possible to change the carrier density with almost no carrier recombination.

According to this embodiment, since the carrier density may be changed without carrier recombination, it is possible to change an oscillation frequency or phase of light introduced from the outside at a high speed while keeping the narrow spectral linewidth.

Incidentally, the present invention is not limited to the above-mentioned embodiments and it is possible to modify the invention and apply it to various fields without departing from the spirit of the present invention.

For example, the present invention is not limited to these embodiments wherein a buried type DFB laser has been exemplified. Further, the material is not limited to the InGaAsP material but various kinds of semiconductor materials may be used, such as InAlGaP, InGaAsSb, ZnCdSSe, and the like.

If the carrier reservoir layer 14 and the active layer 13 are used to form at least a core of an ARROW (antiresonant reflection optical waveguide), the light confinement coefficient of the reservoir layer 14 is increased so that the equivalent refractivity change may be further increased.

In the above-mentioned embodiments, each semiconductor layer is epitaxially grown on the substrate without lattice mismatching. However, strain can be introduced. If a strain super-lattice is applied to the reservoir layer 14, the effective mass of holes may be smaller, and hence the contribution of holes to the plasma effect may be enhanced. In multi-electrode structures or the like, it is possible to partially apply the layer structure of the present invention to the region of the laser. Also, it is possible to apply the laser of the embodiments to a semiconductor optical amplifier that serves also as a wavelength variable filter by restricting the oscillation.

In addition, the invention may be applied to a semiconductor laser in which the waveguide layer on the n-clad layer side is of a multi-layer structure. Furthermore, it may be applied to a semiconductor laser formed on a p-type substrate or a semi-insulator substrate, a semiconductor laser having a strain MQW active layer, a semiconductor laser having a quantum fine line active layer, a semiconductor laser in which a phase shifter is provided on a diffraction grating, a semiconductor laser having a gain coupling diffraction grating, a semiconductor laser having a window structure close to an emission end face or any other suitable semiconductor lasers.

It will be apparent to those skilled in the art that various modifications and variations can be made in the semiconductor optical device of the present invention without departing from the spirit or scope of the invention. Thus, it is intended that the present invention cover the modifications and variations of the invention provided they come within the scope of the appended claims and their equivalents.

What is claimed is:

1. A semiconductor optical device comprises:

a p-clad layer of a p-type semiconductor;

an n-clad layer of an n-type semiconductor;

a semiconductor active layer, in which injected carriers recombine so as to emit light, disposed between the n-clad layer and the p-clad layer; and a semiconductor carrier reservoir layer disposed between the active layer and at least one of the p-clad layer and the n-clad layer, the carrier reservoir layer being sufficiently thick to accumulate carriers so as to enlarge an oscillation wavelength shift due to a plasma effect relative to an oscillation wavelength shift due to a thermal effect.

2. A semiconductor optical device according to claim 1, wherein, when a hole mobility is smaller than an electron mobility in the carrier reservoir layer, the carrier reservoir layer is disposed between the p-clad layer and the active layer, and, when the electron mobility is smaller than the hole mobility in the carrier reservoir layer, the carrier reservoir layer is disposed between the n-clad layer and the active layer.

3. A semiconductor optical device according to claim 1, wherein the device further comprises a semiconductor barrier layer disposed between the active layer and the carrier reservoir layer to moderate carrier distribution in the carrier reservoir layer.

4. A semiconductor optical device according to claim 1, wherein the device further comprises a semiconductor barrier layer provided in the carrier reservoir layer to divide the carrier reservoir layer into at least first and second separate sections, whereby to moderate carrier distribution in the carrier reservoir layer.

5. A semiconductor optical device according to claim 1, wherein the carrier reservoir layer is divided into plural sections having decreasing band-gap energies in a direction toward the active layer.

6. A semiconductor optical device according to claim 1, wherein the carrier reservoir layer is divided into plural sections, each section having a decreasing band-gap energy in a direction toward the active layer.

7. A semiconductor optical device according to claim 1, wherein a band-gap energy of the carrier reservoir layer is larger than the band-gap energy of the active layer and smaller than the band-gap energy of the one of the n-clad layer and p-clad layer adjacent to carrier reservoir layer.

8. A semiconductor optical device according to claim 1, wherein the thickness of the carrier reservoir layer is about 0.3 μm or more.

9. A semiconductor optical device according to claim 1, wherein the wavelength shift is larger than about 10 pm/mA in absolute value.

10. A semiconductor optical device according to claim 1, wherein the device further comprises a diffraction grating on the active layer so as to provide a cavity.

11. A semiconductor optical device according to claim 10, wherein the device further comprises a phase shift region in the diffraction grating.

12. A semiconductor optical device according to claim 1, wherein the active layer comprises a multi-quantum well structure including a barrier and a well, and a band-gap energy of the carrier reservoir layer is larger than the band-gap energy of the well and smaller than the band-gap energy of one of the n-clad layer and p-clad layer adjacent the carrier reservoir layer.

13. A semiconductor optical device comprising:

an n-clad layer of an n-type semiconductor;

a p-clad layer of a p-type semiconductor;

a semiconductor active layer, in which injected carriers recombine so as to emit light, disposed between the n-clad layer and the p-clad layer; and a semiconductor carrier reservoir layer disposed between the active layer and at least one of the p-clad layer and the n-clad layer, the carrier reservoir layer having a thickness of about 0.3 μm or more to accumulate carriers and thereby shift an oscillation wavelength due to a plasma effect.

14. A semiconductor optical device comprising:

an n-clad layer of an n-type semiconductor;

a p-clad layer of a p-type semiconductor;

a semiconductor active layer, in which injected carriers recombine so as to emit light, disposed between the n-clad layer and the p-clad layer; and a semiconductor carrier reservoir layer disposed between the active layer and at least one of the p-clad layer and the n-clad layer to accumulate carriers so as to shift an oscillation wavelength, the carrier reservoir layer having a thickness in a range where an oscillation wavelength is shifted to a short wavelength direction with increasing driving current.

15. A semiconductor optical device comprising:

an n-clad layer of an n-type semiconductor;

a p-clad layer of a p-type semiconductor;

a semiconductor active layer, in which injected carriers recombine so as to emit light, disposed between the n-clad layer and the p-clad layer; and a semiconductor carrier reservoir layer disposed between the active layer and at least one of the p-clad layer and the n-clad layer, the carrier reservoir layer having a thickness such as to enlarge an oscillation wavelength shift due to a plasma effect relative to the oscillation wavelength shift due to a thermal effect in order to shift an oscillation wavelength in a short wavelength direction with increasing driving current that does not exceed an amount that the oscillation wavelength is shifted in a long wavelength direction without increasing the driving current.

16. A semiconductor optical device comprising:

an n-clad layer of an n-type semiconductor;

a p-clad layer of a p-type semiconductor;

a semiconductor active layer, in which injected carriers recombine so as to emit light, disposed between the n-clad layer and the p-clad layer; and a semiconductor carrier reservoir layer disposed on the active layer, and the carrier reservoir layer having a thickness that satisfies the relation:

$$\xi_{rsv} \cdot L_{rsv} > 2\mu \cdot k \cdot T \cdot W \cdot L \cdot |\eta_T/\eta_N| 1/\mu = (1/2)(1/\mu_e + 1/\mu_h),$$

wherein $\xi_{rsv}$: an optical confinement factor in the carrier reservoir layer $L_{rsv}$: a thickness of the carrier reservoir layer $\mu$: an effective carrier mobility in the carrier reservoir layer $\mu_e$: an electron mobility in the carrier reservoir layer $\mu_h$: a hole mobility in the carrier reservoir layer k: Boltzmann's constant T: an absolute temperature W: a width of the carrier reservoir layer L: a length of the carrier reservoir layer $\eta_T$: a wavelength shift per current due to a thermal effect $\eta_N$: a wavelength shift per carrier density due to a plasma effect.

17. A semiconductor optical device comprising:

a substrate of an n-type semiconductor;

a mesa-shaped strip comprised of:

a semiconductor active layer, in which injected carriers recombine so as to emit light, formed on the substrate, a semiconductor carrier reservoir layer formed on the active layer and having a thickness of about 0.3 μm or more to accumulate carriers and thereby to shift an oscillation wavelength due to a plasma effect;

a current blocking layer formed on both sides of the strip so as to bury the strip; and a p-clad layer of a p-type semiconductor formed on the strip.

18. A semiconductor optical device according to claim 17, wherein the device further comprises a buffer layer of an n-type semiconductor formed on the substrate.

19. A semiconductor optical device according to claim 17, wherein the current blocking layer is made of an insulator material.

20. A semiconductor optical device according to claim 17, wherein the current blocking layer comprises a p-type semiconductor layer formed on the substrate and an n-type semiconductor layer formed on the p-type semiconductor layer.

21. A semiconductor optical device according to claim 20, wherein the p-type semiconductor layer covers a side of the strip.

22. A semiconductor optical device according to claim 20, wherein the active layer comprises a multi-quantum well structure composed of InGaAs wells and InGaAsP barriers, the carrier reservoir layer is made of InGaAsP, the p-clad layer is made of p-InP, the substrate is made of n-InP, the p-type semiconductor layer is made of p-InP, and the n-type semiconductor layer is made of n-InP.

23. A semiconductor optical device according to claim 17, wherein the device further comprises a semiconductor waveguide layer disposed between the active layer and the substrate.

24. A semiconductor optical device according to claim 22, wherein the device further comprises a waveguide layer of InGaAsP disposed between the active layer and the substrate.

25. A semiconductor optical device comprising:

a p-clad layer of a p-type semiconductor;

an n-clad layer of an n-type semiconductor;

a semiconductor active layer, in which injected carriers recombine so as to emit light, disposed between the n-clad layer and the p-clad layer;

a semiconductor carrier reservoir layer disposed between the active layer and at least one of the p-clad layer and the n-clad layer, the carrier reservoir layer being sufficiently thick to accumulate carriers so as to enlarge an oscillation wavelength shift due to a plasma effect relative to an oscillation wavelength shift due to a thermal effect and the carriers injected into said semiconductor active layer through said semiconductor carrier reservoir layer.

26. A semiconductor optical device according to claim 25, wherein, when a hole mobility is smaller than an electron mobility in the carrier reservoir layer, the carrier reservoir layer is disposed between the p-clad layer and the active layer, and, when the electron mobility is smaller than the hole mobility in the carrier reservoir layer, the carrier reservoir layer is disposed between the n-clad layer and the active layer.

27. A semiconductor optical device according to claim 25, wherein the device further comprises a semiconductor barrier layer disposed between the active layer and the carrier reservoir layer to moderate carrier distribution in the carrier reservoir layer.

28. A semiconductor optical device according to claim 25, wherein the device further comprises a semiconductor barrier layer provided in the carrier reservoir layer to divide the carrier reservoir layer into at least first and second separate sections, whereby to moderate carrier distribution in the carrier reservoir layer.

29. A semiconductor optical device according to claim 25, wherein the carrier reservoir layer is divided into plural sections having decreasing band-gap energies in a direction toward the active layer.

30. A semiconductor optical device according to claim 25, wherein the carrier reservoir layer is divided into plural sections, each section having a decreasing band-gap energy in a direction toward the active layer.

31. A semiconductor optical device according to claim 25, wherein a band-gap energy of the carrier reservoir layer is larger than the band-gap energy of the active layer and smaller than the band-gap energy of the one of the n-clad layer and p-clad layer adjacent to the carrier reservoir layer.

32. A semiconductor optical device according to claim 25, wherein the thickness of the carrier reservoir layer is about 0.3 μm or more.

33. A semiconductor optical device according to claim 25, wherein the wavelength shift is larger than about 10 pm/mA in absolute value.

34. A semiconductor optical device according to claim 25, wherein the device further comprises a diffraction grating on the active layer so as to provide a cavity.

35. A semiconductor optical device according to claim 34, wherein the device further comprises a phase shift region in the diffraction grating.

36. A semiconductor optical device according to claim 25, wherein the active layer comprises a multi-quantum well structure including a barrier and a well, and a band-gap energy of the carrier reservoir layer is larger than the band-gap energy of the well and smaller than the band-gap energy of one of the n-clad layer and p-clad layer adjacent the carrier reservoir layer.

37. A semiconductor optical device comprising:

an n-clad layer of an n-type semiconductor;

a p-clad layer of a p-type semiconductor;

a semiconductor active layer, in which injected carriers recombine so as to emit light, disposed between the n-clad layer and the p-clad layer;

a semiconductor carrier reservoir layer disposed between the active layer and at least one of the p-clad layer and the n-clad layer, the carrier reservoir layer having a thickness of about 0.3 μm or more to accumulate carriers and thereby shift an oscillation wavelength due to a plasma effect and the carriers injected into said semiconductor active layer through said semiconductor carrier reservoir layer.

38. A semiconductor optical device comprising:

an n-clad layer of an n-type semiconductor;

a p-clad layer of a p-type semiconductor;

a semiconductor active layer, in which injected carriers recombine so as to emit light, disposed between the n-clad layer and the p-clad layer;

a semiconductor carrier reservoir layer disposed between the active layer and at least one of the p-clad layer and the n-clad layer to accumulate carriers so as to shift an oscillation wavelength, the carrier reservoir layer having a thickness in a range where an oscillation wavelength is shifted to a short wavelength direction with increasing driving current and the injection of carriers into said semiconductor active layer through said semiconductor carrier reservoir layer.

39. A semiconductor optical device comprising:

an n-clad layer of an n-type semiconductor;

a p-clad layer of a p-type semiconductor;

a semiconductor active layer, in which injected carriers recombine so as to emit light, disposed between the n-clad layer and the p-clad layer;

a semiconductor carrier reservoir layer disposed between the active layer and at least one of the p-clad layer and the n-clad layer, the carrier reservoir layer having a thickness such as to enlarge an oscillation wavelength shift due to a plasma effect relative to the oscillation wavelength shift due to a thermal effect in order to shift an oscillation wavelength in a short wavelength direction with increasing driving current that does not exceed an amount that the oscillation wavelength is shifted in a long wavelength direction without increasing the driving current, carriers being injected into said semiconductor active layer through said semiconductor carrier reservoir layer.

40. A semiconductor optical device comprising:

an n-clad layer of an n-type semiconductor;

a p-clad layer of a p-type semiconductor;

a semiconductor active layer, in which injected carriers recombine so as to emit light, disposed between the n-clad layer and the p-clad layer;

a semiconductor carrier reservoir layer disposed on the active layer, and the carrier reservoir layer having a thickness that satisfies the relation:

$$\xi_{rsv} \cdot L_{rsv} > 2\mu \cdot k \cdot T \cdot W \cdot L \cdot |\eta_T/\eta_N| 1/\mu = (\tfrac{1}{2})(1/\mu_e + 1/\mu_h),$$

wherein $\xi_{rsv}$: an optical confinement factor in the carrier reservoir layer $L_{rsv}$: a thickness of the carrier reservoir layer $\mu$: an effective carrier mobility in the carrier reservoir layer $\mu_e$: an electron mobility in the carrier reservoir layer $\mu_h$: a hole mobility in the carrier reservoir layer k: Boltzmann's constant T: an absolute temperature W: a width of the carrier reservoir layer L: a length of the carrier reservoir layer $\eta_T$: a wavelength shift per current due to a thermal effect $\eta_N$: a wavelength shift per carrier density due to a plasma effect and carriers injected into said semiconductor active layer through said semiconductor carrier reservoir layer.

41. A semiconductor optical device comprising:

a substrate of an n-type semiconductor;

a mesa-shaped strip comprised of:

a semiconductor active layer, in which injected carriers recombine so as to emit light, formed on the substrate, a semiconductor carrier reservoir layer formed on the active layer and having a thickness of about 0.3 μm or more to accumulate carriers and thereby to shift an oscillation wavelength due to a plasma effect and the carriers injected into said semiconductor active layer through said semiconductor carrier reservoir layer;

a current blocking layer formed on both sides of the strip so as to bury the strip; and a p-clad layer of a p-type semiconductor formed on the strip.

42. A semiconductor optical device according to claim 41, wherein the device further comprises a buffer layer of an n-type semiconductor formed on the substrate.

43. A semiconductor optical device according to claim 41, wherein the current blocking layer is made of an insulator material.

44. A semiconductor optical device according to claim 41, wherein the current blocking layer comprises a p-type semiconductor layer formed on the substrate and an n-type semiconductor layer formed on the p-type semiconductor layer.

45. A semiconductor optical device according to claim 44, wherein the p-type semiconductor layer covers a side of the strip.

46. A semiconductor optical device according to claim 44, wherein the active layer comprises a multi-quantum well structure composed of InGaAs wells and InGaAsP barriers, the carrier reservoir layer is made of InGaAsP, the p-clad layer is made of p-InP, the substrate is made of n-InP, the p-type semiconductor layer is made of p-InP, and the n-type semiconductor layer is made of n-InP.

47. A semiconductor optical device according to claim 44, wherein the device further comprises a semiconductor waveguide layer disposed between the active layer and the substrate.

48. A semiconductor optical device according to claim 46, wherein the device further comprises a waveguide layer of InGaAsP disposed between the active layer and the substrate.

* * * * *